(12) United States Patent
Lee et al.

(10) Patent No.: US 12,087,806 B2
(45) Date of Patent: Sep. 10, 2024

(54) DISPLAY DEVICE AND TILED DISPLAY DEVICE INCLUDING THE SAME

(71) Applicant: Samsung Display Co., LTD., Yongin-si (KR)

(72) Inventors: Ki Yeup Lee, Yongin-si (KR); Sang Yong No, Seoul (KR); Ji Yeon Choi, Hwaseong-si (KR); Tae Ho Kang, Siheung-si (KR); Hwa Rang Lee, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 533 days.

(21) Appl. No.: 17/483,060

(22) Filed: Sep. 23, 2021

(65) Prior Publication Data

US 2022/0231079 A1    Jul. 21, 2022

(30) Foreign Application Priority Data

Jan. 18, 2021 (KR) ........................ 10-2021-0006757

(51) Int. Cl.
*H01L 27/15* (2006.01)
*H01L 23/60* (2006.01)
(Continued)

(52) U.S. Cl.
CPC ............ *H01L 27/156* (2013.01); *H01L 23/60* (2013.01); *H01L 33/483* (2013.01); *H01L 33/50* (2013.01)

(58) Field of Classification Search
CPC ............ H01L 27/0292; H01L 27/0288; H01L 27/0296; H01L 27/0248; H01L 23/60;
(Continued)

(56) References Cited

U.S. PATENT DOCUMENTS 9,465,258 B2 * 10/2016 Wang ................... G02F 1/13454
2019/0304386 A1 * 10/2019 Kim .......................... G09G 3/30
(Continued)

FOREIGN PATENT DOCUMENTS

| CN | 104969283 | 10/2015 |
| CN | 107895942 | 4/2018 |

(Continued)

OTHER PUBLICATIONS

Mahdi Elghazali et al., "Design Methodology for ESD Power Supply Clamps in Advanced CMOS Technologies", Proc. 2017 Annual Meeting of the Electrostatics of America, Sep. 23, 2020, pp. 1-8.

*Primary Examiner* — Mark W Tornow
*Assistant Examiner* — Priya M Rampersaud
(74) *Attorney, Agent, or Firm* — KILE PARK REED & HOUTTEMAN PLLC

(57) ABSTRACT

A display device includes a first substrate including a display area comprising pixels, and a non-display area surrounding the display area, a thin film transistor layer disposed on the first substrate and comprising a thin film transistor, a second substrate disposed on the thin film transistor layer and facing the first substrate, a sealing part disposed between the first substrate and the second substrate in the non-display area, and bonding the first and second substrates, a metal line disposed in the non-display area on the thin film transistor layer and overlapping the sealing part, and an antistatic member comprising a support supported by the metal line, a first receiver protruding from a top portion of the support to an exterior of the sealing part, and a second receiver protruding from a bottom portion of the support toward the exterior of the sealing part and facing the first receiver.

20 Claims, 16 Drawing Sheets

(51) Int. Cl.
*H01L 33/48* (2010.01)
*H01L 33/50* (2010.01)

(58) Field of Classification Search
CPC ..... H01L 23/62; H01L 23/642; H01L 29/408;
H01L 2224/75723; H01L 2224/76723;
H01L 2224/77756; H01L 2224/78723;
H01L 2224/79723; H01L 2224/8011;
H01L 2224/8311; H01L 2224/8511; H01L
25/0753; H01L 25/167; H01L 27/156;
H01L 33/483; H01L 33/50; H01L 33/58;
H01L 33/62; H01L 27/1218; H01L
27/124; G02F 2202/22; G02F 1/1362;
G02F 1/136204; G02F 1/136286

See application file for complete search history.

(56) References Cited

U.S. PATENT DOCUMENTS

| | | | |
|---|---|---|---|
| 2021/0064169 A1* | 3/2021 | Kim | H10K 50/8426 |
| 2021/0249627 A1* | 8/2021 | Lee | H10K 59/131 |
| 2022/0102476 A1* | 3/2022 | Kim | H10K 59/1213 |

FOREIGN PATENT DOCUMENTS

| | | |
|---|---|---|
| KR | 10-1104491 | 1/2012 |
| KR | 10-1308445 | 9/2013 |
| KR | 10-2113607 | 5/2020 |
| KR | 10-2121341 | 6/2020 |

* cited by examiner

ESD: RCV1, RCV2, SPT, IST

ESD: IST, RCV1, RCV2, SPT

ESD: ESM1, ESM2, ESM3, ESM4, ESM5

DISPLAY DEVICE AND TILED DISPLAY DEVICE INCLUDING THE SAME

CROSS-REFERENCE TO RELATED APPLICATION(S)

This application claims priority to and the benefit of Korean Patent Application No. 10-2021-0006757 under 35 U.S.C. § 119, filed on Jan. 18, 2021, in the Korean Intellectual Property Office (KIPO), the entire contents of which are incorporated herein by reference.

BACKGROUND

1. Technical Field

The disclosure relates to a display device and a tiled display device including the same.

2. Description of Related Art

With the advance of information-oriented society, more and more demands are placed on display devices for displaying images in various ways. For example, display devices are mounted in various electronic devices such as smartphones, digital cameras, laptop computers, navigation devices, smart televisions, electronic frames and electronic billboards, or similar application cases are on the rise. Display devices may be of various types such as a liquid crystal display device, a field emission display device, an organic light emitting display device and a light emitting diode display device, and may deliver visual information in various ways. The display device may include a display area which displays and delivers an image and information and a non-display area (or a bezel) which provides a driving voltage and a reference voltage to the display area but does not emit light.

A tiled display device is a futuristic display device having a remarkable advantage of reducing the resources and time invested for clear image quality and improved driving performance when developing a single large-scale display device. The tiled display device drives an individual display device with high definition and excellent performance to display only a partial region in the whole screen, thereby providing an entire integrated high-definition screen regardless of its size and installation location.

Meanwhile, the inside of the display device and a driving circuit thereof may be damaged by static electricity introduced from the outside, and static electricity delivered through the exterior of the display device being manufactured may destroy circuits of an emission area and a non-emission area.

As the tiled display device is manufactured by putting a filler between individual bezels in an inner region, a boundary part called a seam which is wider than the width of the bezel is formed and makes it difficult to understand the contents on the screen when watching a video, which may reduce a sense of immersion. Accordingly, when the width of the bezel is reduced, the fatigue caused by watching the video may be reduced, but the static electricity generated in a connection process of the individual display devices may affect the reliability of a product.

SUMMARY

Aspects of the disclosure provide a display device capable of blocking static electricity from entering into a display layer, preventing a defect of the display device and improving the reliability by electromagnetically sensing, within a bezel, the static electricity, introduced from the outside of the display device to discharge the static electricity and dissipating and dispersing the static electricity through a charging and discharging phenomenon, and a tiled display device including the same.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an embodiment of the disclosure, a display device may comprise a first substrate including a display area comprising a plurality of pixels, and a non-display area surrounding the display area, a thin film transistor layer disposed on the first substrate and comprising a thin film transistor, a second substrate disposed on the thin film transistor layer and facing the first substrate, a sealing part disposed between the first substrate and the second substrate in the non-display area, and bonding the first substrate and the second substrate, a metal line disposed in the non-display area on the thin film transistor layer and overlapping the sealing part, and an antistatic member comprising a support supported by the metal line, a first receiver protruding from a top portion of the support to an exterior of the sealing part, and a second receiver protruding from a bottom portion of the support to the exterior of the sealing part and facing the first receiver.

The metal line may include a pad portion including a plurality of contact holes, the pad portion being electrically connected to the antistatic member, and a plurality of slits extending in a first direction in a plan view, spaced apart by the pad portion, and penetrating the metal line in a thickness direction of the display device.

The antistatic member may comprise a plurality of insertion parts protruding from a lower end of the support and inserted into the plurality of contact holes of the pad portion.

The first receiver and the second receiver may be implemented as metal plates spaced apart from each other, facing each other, and forming a capacitor.

The metal line may extend along the non-display area and may be grounded with a voltage.

The display device may further comprise a substrate insulating layer directly contacting and overlapping an entire top surface of the first substrate.

The display device may further comprise a light emitting element layer disposed on the thin film transistor layer and including a light emitting element, a wavelength conversion layer disposed on the light emitting element layer and including a wavelength conversion part corresponding to each of the plurality of pixels, and a color filter layer disposed between the wavelength conversion layer and the second substrate, the color filter layer including a color filter corresponding to each of the plurality of pixels.

The thin film transistor layer may comprise an antistatic electrode surrounding each of the plurality of pixels.

The antistatic electrode may include a first antistatic electrode disposed on the first substrate, and a second antistatic electrode disposed on the first antistatic electrode, spaced apart from the first antistatic electrode, and facing the first antistatic electrode.

The thin film transistor layer may comprise a connection electrode electrically connecting the thin film transistor to the light emitting element. The first antistatic electrode and a gate electrode of the thin film transistor may be disposed on a same layer, and the second antistatic electrode and as the connection electrode may be disposed on a same layer.

According to an embodiment of the disclosure, a display device may comprise a first substrate including a display area comprising a plurality of pixels, and a non-display area surrounding the display area, a thin film transistor layer disposed on the first substrate and comprising a plurality of thin film transistors, a pixel electrode disposed on the thin film transistor layer, a common electrode spaced apart from the pixel electrode and facing the pixel electrode, a second substrate disposed on the common electrode and facing the first substrate, a sealing part disposed between the first substrate and the second substrate in the non-display area, and bonding the first substrate and the second substrate, a metal line disposed in the non-display area on the thin film transistor layer and overlapping the sealing part, and an antistatic member comprising a support supported by the metal line and electrically connected to the common electrode, and a receiver protruding from a bottom of the support to an exterior of the sealing part and facing the common electrode.

The common electrode and the receiver may be implemented as metal plates spaced apart from each other, facing each other, and forming a capacitor.

According to an embodiment of the disclosure, a display device may comprise a first substrate including a display area comprising a plurality of pixels, and a non-display area surrounding the display area, a thin film transistor layer disposed on the first substrate and comprising a plurality of thin film transistors, a second substrate disposed on the thin film transistor layer and facing the first substrate, a sealing part disposed between the first substrate and the second substrate in the non-display area, and bonding the first substrate and the second substrate, a metal line disposed in the non-display area on the thin film transistor layer and overlapping the sealing part, and an antistatic member comprising at least one plate electrically connected to the metal line and facing the metal line, and a receiver electrically connected to the at least one plate, protruding toward an exterior of the sealing part, and facing the at least one plate.

The antistatic member may comprise a first antistatic member including the receiver and a first insertion part protruding from the receiver toward the metal line, a second antistatic member including a first plate electrically connected to the first insertion part and facing the receiver, and a second insertion part protruding from the first plate toward the metal line, and a third antistatic member including a second plate electrically connected to the second insertion part and facing the first plate, and a third insertion part protruding from the second plate and electrically connected to the metal line.

The antistatic member may comprise a plurality of plates and a plurality of insertion parts disposed between the second antistatic member and the third antistatic member.

The first insertion part may be disposed on a side of the receiver, the second insertion part may be disposed on another side of the first plate, and the first and second insertion parts may be spaced apart from each other in a plan view.

The receiver and the first plate may be spaced apart from each other, facing each other, and forming a first capacitor, the first plate and the second plate may be spaced apart from each other, facing each other, and forming a second capacitor, and the second plate and the metal line may be spaced apart from each other, facing each other, and forming a third capacitor.

The display device may further comprise a substrate insulating layer directly contacting and overlapping an entire top surface of the first substrate.

According to an embodiment of the disclosure, a tiled display device may comprise a first display device including a first display area comprising pixels, a second display device including a second display area adjacent to the first display area, and a bonding member connecting the first display device to the second display device. Each of the first and second display devices may comprise a first substrate including a display area and a non-display area, a thin film transistor layer disposed on the first substrate, a second substrate disposed on the thin film transistor layer and facing the first substrate, a sealing part disposed between the first substrate and the second substrate in the non-display area, and bonding the first substrate and the second substrate, a metal line disposed in the non-display area on the thin film transistor layer and overlapping the sealing part, and an antistatic member comprising a support supported by the metal line, a first receiver protruding from a top portion of the support to an exterior of the sealing part, and a second receiver protruding from a bottom portion of the support to the exterior of the sealing part and facing the first receiver. The antistatic member of the first display device and the antistatic member of the second display device may face each other, and the bonding member may be disposed between the antistatic member of the first display device and the antistatic member of the second display device.

The first receiver and the second receiver may be implemented as metal plates spaced apart, face each other, and form a capacitor.

According to the display device and the tiled display device including the same according to the embodiments, by including first and second receivers forming a capacitor at an edge between a first substrate and a second substrate, static electricity may be prevented from entering inside a display layer by releasing a part of the static electricity introduced from the outside through a capacitor and dispersing and consuming the other part of the static electricity along a metal line. Accordingly, the display device and the tiled display device including the same may improve the static electricity reception sensitivity to absorb electrostatic energy, thereby preventing a defect of the display device to improve the reliability of the display device.

It should be noted that the effects of the disclosure are not limited to those described above, and other effects of the disclosure will be apparent from the following description.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
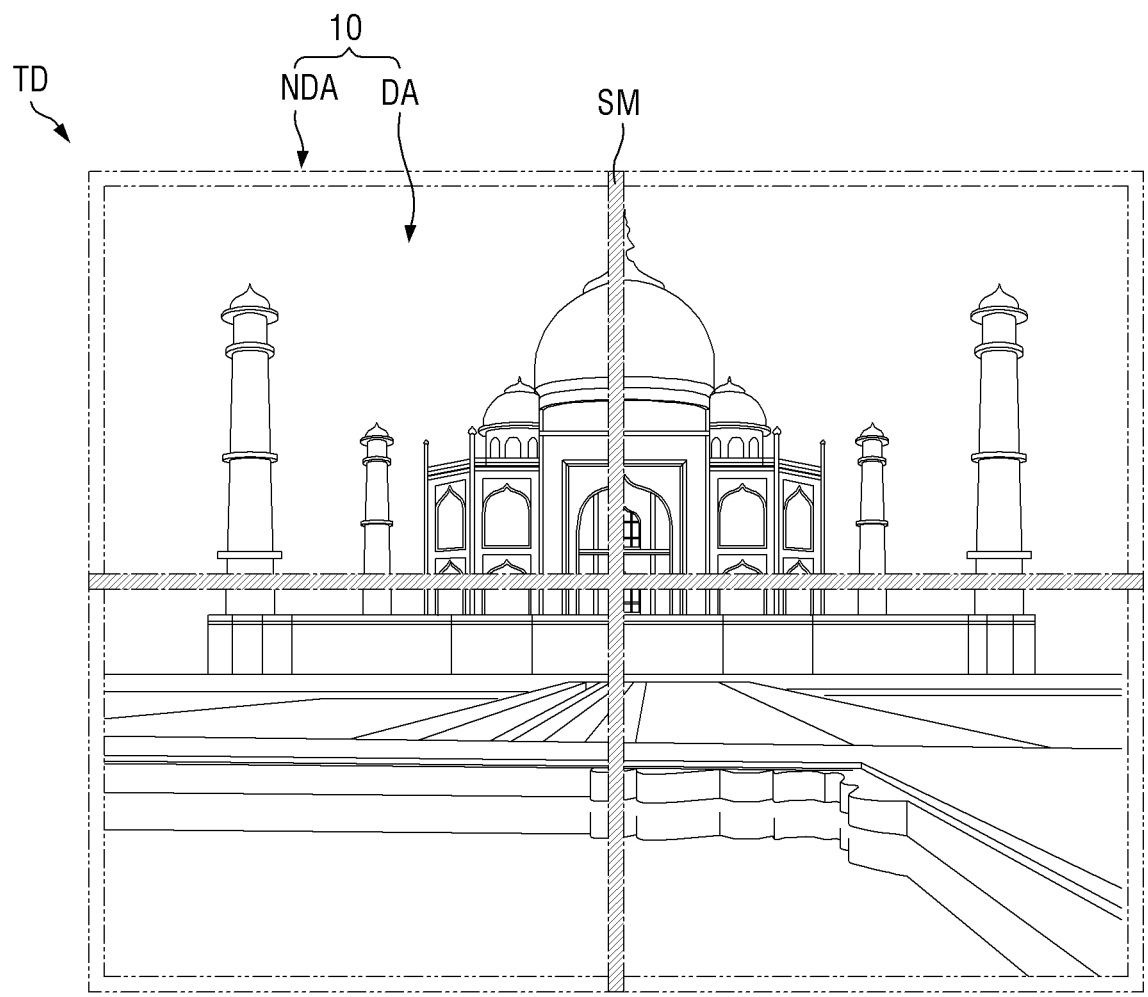
FIG. 1 is a plan view schematically illustrating a tiled display device according to an embodiment.
Figure 1:
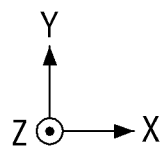

In the following description, for the purposes of explanation, numerous details are set forth in order to provide a thorough understanding of various embodiments or implementations of the disclosure. As used herein "embodiments" and "implementations" are interchangeable words that are non-limiting examples of devices or methods employing one or more of the implementations or embodiments disclosed herein. It is apparent, however, that various embodiments may be practiced without these details or with one or more equivalent arrangements. In other instances, structures and devices may be shown in block diagram form in order to avoid unnecessarily obscuring various embodiments. Further, various embodiments may be different, but do not have to be exclusive. For example, shapes, configurations, and characteristics of an embodiment may be used or implemented in another embodiment without departing from the scope of the disclosure.

Unless otherwise specified, the illustrated embodiments are to be understood as providing features of varying detail of some or a number of ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment is implemented differently, a process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be substantially perpendicular to one another, or may represent different directions that may not be perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

The terms "and" and "or" may be used in the conjunctive or disjunctive sense and may be understood to be equivalent to "and/or."

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (for example, as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (for example, rotated 90 degrees or about 90 degrees or at other orientations), and, as such, the spatially relative descriptors used herein interpreted accordingly.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as "not overlapping" or "to not overlap" another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terminology used herein is for the purpose of describing embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," "has," and/or "having," and/or variations thereof when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

For example, "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Some or a number of embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (for example, microcode) to perform various functions discussed herein and may optionally be driven by firmware and/or software. It is also contemplated that each block, unit, and/or module may be implemented by dedicated hardware, or as a combination of dedicated hardware to perform some or a number of functions and a processor (for example, one or more programmed microprocessors and associated circuitry) to perform other functions. Also, each block, unit, and/or module of some or a number of embodiments may be physically separated into two or more interacting and discrete blocks, units, and/or modules without departing from the scope of the disclosure. Further, the blocks, units, and/or modules of some or a number of embodiments may be physically combined into more complex blocks, units, and/or modules without departing from the scope of the disclosure.

It will be understood that the terms "contact," "connected to," and "coupled to" may include a physical and/or electrical contact, connection or coupling.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or overly formal sense, unless clearly so defined herein.

FIG. 1 is a schematic plan view illustrating a tiled display device according to an embodiment.

Referring to FIG. 1, a tiled display device TD may include display devices 10. The display devices 10 may be arranged in a grid form, but the disclosure is not limited thereto. The display devices 10 may be connected in a first direction (an X-axis direction) or a second direction (a Y-axis direction), and the tiled display device TD may have a particular shape. For example, the display devices 10 may have the same size, but the disclosure is not limited thereto. For another example, the display devices 10 may have different sizes.

Each of the display devices 10 may have a rectangular shape including long sides and short sides. The display devices 10 may be arranged such that the long sides or the short sides thereof are connected to each other. Some (or a part) of the display devices 10 may be disposed at the edge of the tiled display device TD to form a side of the tiled display device TD. Some others (or another part) of the display devices 10 may be disposed at corners of the tiled display device TD to form two adjacent sides of the tiled display device TD. Yet some others (or another part) of the display devices 10 may be disposed on an inner side of the tiled display device TD and may be surrounded by other display devices 10.

Each of the display devices 10 may include a display area DA and a non-display area NDA. The display area DA may include pixels to display an image. For example, each of the pixels may include an organic light emitting diode including an organic light emitting layer, a micro LED, a quantum dot light emitting diode including a quantum dot light emitting layer, or an inorganic light emitting element including an inorganic semiconductor. As another example, each of the display devices 10 may include a liquid crystal display panel with a liquid crystal layer disposed between a first substrate and a second substrate. The non-display area NDA may be disposed around the display area DA to surround the display area DA and may not display an image.

The tiled display device TD may have a planar shape as a whole, but the disclosure is not limited thereto. The tiled display device TD may have a three-dimensional shape to provide a three-dimensional effect to a user. For example, in case that the tiled display device TD has a three-dimensional shape, at least some of the display devices 10 may have a curved shape. As another example, the display devices 10 may each have a planar shape and may be connected to each other at a predetermined angle, so that the tiled display device TD may have a three-dimensional shape.

The tiled display device TD may include a coupling area SM disposed between display areas DA. The tiled display device TD may be formed by connecting non-display areas NDA of the adjacent display devices 10. The display devices 10 may be connected to each other by a bonding member or an adhesive member disposed in the coupling area SM. The coupling area SM of each of the display devices 10 may not include a pad portion and a flexible film attached to a pad portion. Accordingly, the distance between the display areas DA of the display devices 10 may be small enough that the coupling area SM between the display devices 10 is not recognized by the user. The reflectance of external light of the display areas DA of the display devices 10 may be substantially the same as that of the coupling area SM between the display devices 10. Accordingly, in the tiled display device TD, the coupling area SM between the display devices 10 may be prevented from being recognized by the user, thereby reducing a sense of disconnection between the display devices 10 and improving a sense of immersion in an image.

Figure 2:
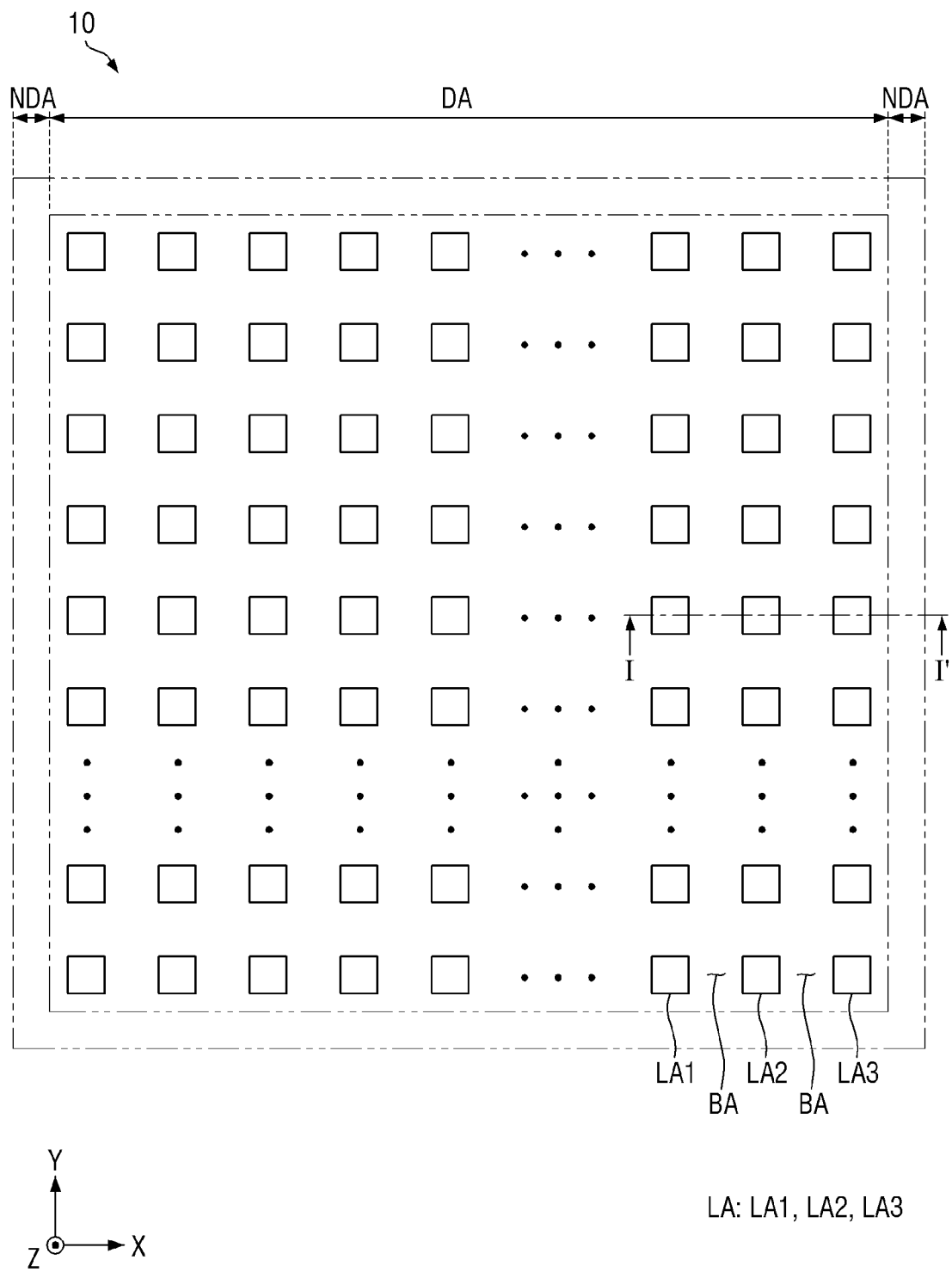
FIG. 2 is a plan view schematically illustrating a display device according to an embodiment.

FIG. 2 is a schematic plan view illustrating a display device according to an embodiment.

Referring to FIG. 2, the display device 10 may include pixels arranged in rows and columns in the display area DA. Each of the pixels may include an emission area LA defined by a pixel defining layer or a bank and may emit light having a predetermined peak wavelength through the emission area LA. For example, the display area DA of the display device 10 may include first to third emission areas LA1, LA2, and LA3. Each of the first to third emission areas LA1, LA2, and LA3 may be an area in which light generated from a light emitting element of the display device 10 is emitted to the outside of the display device 10.

The first to third emission areas LA1, LA2, and LA3 may emit light having a predetermined peak wavelength to the outside of the display device 10. The first emission area LA1 may emit light of a first color, the second emission area LA2 may emit light of a second color, and the third emission area LA3 may emit light of a third color. For example, the first color light may be red light having a peak wavelength in a range from about 610 nm to about 650 nm, the second color light may be green light having a peak wavelength in a range from about 510 nm to about 550 nm, and the third color light may be blue light having a peak wavelength in a range from about 440 nm to about 480 nm, but the disclosure is not limited thereto.

The first to third emission areas LA1, LA2, and LA3 may be sequentially arranged repetitively in the first direction (e.g., the X-axis direction) in the display area DA. For example, the first emission area LA1 may be larger in size than the second emission area LA2, and the second emission area LA2 may be larger in size than the third emission area LA3. As another example, the first emission area LA1, the second emission area LA2, and the third emission area LA3 may be substantially the same in size.

The display area DA of the display device 10 may include a light blocking area BA surrounding the emission areas LA. The light blocking area BA may prevent the colored lights emitted from the first to third emission areas LA1, LA2, and LA3, from mixing with one another.

Figure 3:
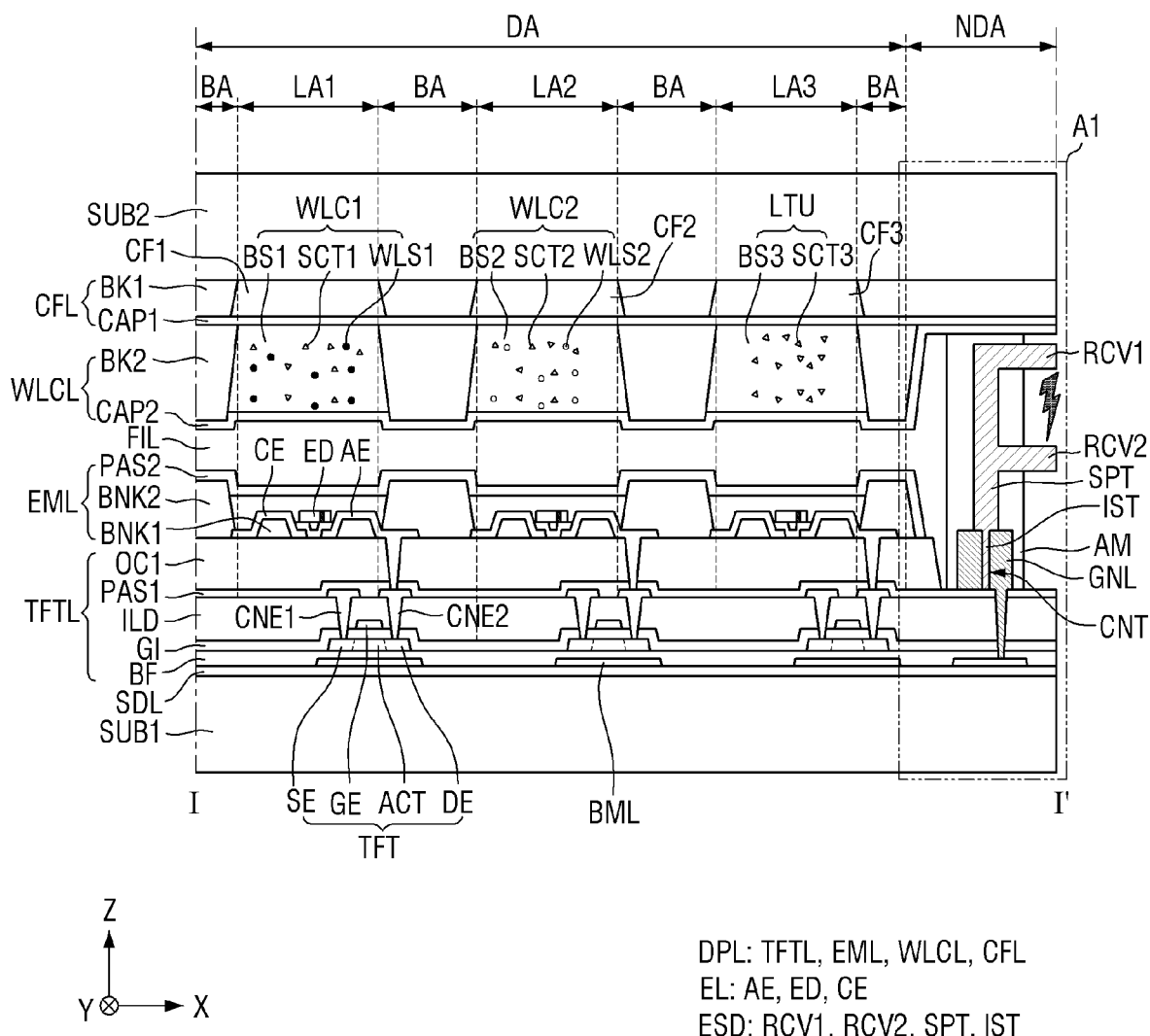
FIG. 3 is a schematic cross-sectional view of an example taken along line I-I' of FIG. 2.

FIG. 3 is a schematic cross-sectional view of an example taken along line I-I' of FIG. 2.

Referring to FIG. 3, the display area DA of the display device 10 may include first to third emission areas LA1, LA2, and LA3. Each of the first to third emission areas LA1, LA2, and LA3 may be an area in which light generated from a light emitting diode ED of the display device 10 is emitted to the outside of the display device 10.

The display device 10 may include a first substrate SUB1, a substrate insulating layer SDL, a display layer DPL, a filler FIL, a sealing part AM, a second substrate SUB2, a metal line GNL, and an antistatic member ESD.

The first substrate SUB1 may be a base substrate and may be made of an insulating material such as polymer resin. For example, the first substrate SUB1 may be a rigid substrate. In case that the first substrate SUB1 is a rigid substrate, the first substrate SUB1 may include a glass material or a metal material, but the disclosure is not limited thereto. As another example, the first substrate SUB1 may be a flexible substrate which can be bent, folded, and rolled. In case that the first substrate SUB1 is a flexible substrate, the first substrate SUB1 may include polyimide (PI), but the disclosure is not limited thereto.

The substrate insulating layer SDL may directly cover (or directly contact and overlap) the top surface of the first substrate SUB1. The substrate insulating layer SDL may be disposed between the first substrate SUB1 and a thin film transistor layer TFTL. The substrate insulating layer SDL may be formed before the thin film transistor layer TFTL is stacked on the first substrate SUB1 to insulate the top surface of the first substrate SUB1. The substrate insulating layer SDL may prevent a metal material from being directly disposed on the first substrate SUB1. Accordingly, the substrate insulating layer SDL may prevent the static electricity from being introduced along the top surface of the first substrate SUB1. For example, the substrate insulating layer SDL may contain at least one of silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride.

The display layer DPL may be disposed on the substrate insulating layer SDL. The display layer DPL may include the thin film transistor layer TFTL, a light emitting element layer EML, a wavelength conversion layer WLCL and a color filter layer CFL. The thin film transistor layer TFTL may include a light blocking layer BML, a buffer layer BF, a thin film transistor TFT, a gate insulating layer GI, an interlayer insulating layer ILD, first and second connection electrodes CNE1 and CNE2, a first passivation layer PAS1, and a first planarization layer OC1.

The light blocking layer BML may be disposed on the substrate insulating layer SDL. The light blocking layer BML may block external light incident on the thin film transistor TFT. For example, the light blocking layer BML may be formed as a single layer or multiple layers made of any one of molybdenum (Mo), aluminum (Al), chromium (Cr), gold (Au), titanium (Ti), nickel (Ni), neodymium (Nd), and copper (Cu), or an alloy thereof. As another example, the light blocking layer BML may be an organic layer including a black pigment.

The buffer layer BF may cover (or overlap) the substrate insulating layer SDL and the light blocking layer BML. The buffer layer BF may be formed of (or include) an inorganic material capable of preventing infiltration of air or moisture.

For example, the buffer layer BF may include inorganic films laminated or stacked alternately.

The thin film transistor TFT may be disposed on the buffer layer BF and may form (or constitute) a pixel circuit of each of the pixels. For example, the thin film transistor TFT may be a switching transistor or a driving transistor of the pixel circuit. The thin film transistor TFT may include a semiconductor region ACT, a gate electrode GE, a source electrode SE, and a drain electrode DE.

The semiconductor region ACT, the source electrode SE, and the drain electrode DE may be disposed on the buffer layer BF. The semiconductor region ACT may overlap the gate electrode GE in the thickness direction and may be insulated from the gate electrode GE by the gate insulating layer GI. The source electrode SE and the drain electrode DE may be provided by making a material of the semiconductor region ACT conductive.

The gate electrode GE may be disposed on the gate insulating layer GI. The gate electrode GE may overlap the semiconductor region ACT with the gate insulating layer GI interposed therebetween.

The gate insulating layer GI may be provided on the semiconductor region ACT, the source electrode SE, and the drain electrode DE. For example, the gate insulating layer GI may cover (or overlap) the semiconductor region ACT, the source electrode SE, the drain electrode DE, and the buffer layer BF and may insulate the semiconductor region ACT from the gate electrode GE. The gate insulating layer GI may include a contact hole through which each of the first and second connection electrodes CNE1 and CNE2 passes.

The interlayer insulating layer ILD may cover (or overlap) the gate electrode GE and the gate insulating layer GI. The interlayer insulating layer ILD may include a contact hole through which each of the first and second connection electrodes CNE1 and CNE2 passes. The contact hole of the interlayer insulating layer ILD may be connected to the contact hole of the gate insulating layer GI.

The first and second connection electrodes CNE1 and CNE2 may be disposed on the interlayer insulating layer ILD to be spaced apart from each other. The first connection electrode CNE1 may electrically connect a data line or power line to the source electrode SE of the thin film transistor TFT. The first connection electrode CNE1 may electrically contact the source electrode SE through the contact holes provided in the interlayer insulating layer ILD and the gate insulating layer GI.

The second connection electrode CNE2 may electrically connect the drain electrode DE of the thin film transistor TFT to a first electrode AE of a light emitting element EL. The second connection electrode CNE2 may electrically contact the drain electrode DE through the contact holes provided in the interlayer insulating layer ILD and the gate insulating layer GI.

The first passivation layer PAS1 may cover (or overlap) the first and second connection electrodes CNE1 and CNE2 and the interlayer insulating layer ILD. The first passivation layer PAS1 may protect the thin film transistor TFT. The first passivation layer PAS1 may include a contact hole through which the first electrode AE of the light emitting element EL passes.

The first planarization layer OC1 may be provided on the first passivation layer PAS1 to planarize a top portion of the thin film transistor layer TFTL. For example, the first planarization layer OC1 may include a contact hole through which the first electrode AE of the light emitting element EL passes. Here, the contact hole of the first planarization layer OC1 may be connected to the contact hole of the first passivation layer PAS1. The first planarization layer OC1 may include an organic material.

The light emitting element layer EML may include a light emitting element EL, a first bank BNK1, a second bank BNK2, a second passivation layer PAS2, and a second planarization layer (not shown).

The light emitting element EL may be disposed on the thin film transistor layer TFTL. The light emitting element EL may include the first electrode AE, a second electrode CE, and the light emitting diode ED.

The first electrode AE may be disposed on the first planarization layer OC1. For example, the first electrode AE may be disposed on the first bank BNK1 provided on the first planarization layer OC1 to cover (or overlap) the first bank BNK1. The first electrode AE may be disposed to overlap one of the first to third emission areas LA1, LA2, and LA3 defined by the second bank BNK2. The first electrode AE may be electrically connected to the drain electrode DE of the thin film transistor TFT by the second connection electrode CNE2. The first electrode AE may be an anode electrode of the light emitting element EL, but the disclosure is not limited thereto.

The second electrode CE may be disposed on the first planarization layer OC1 to be spaced apart from the first electrode AE. For example, the second electrode CE may be disposed on the first bank BNK1 disposed on the first planarization layer OC1 to cover (or overlap) the first bank BNK1. The second electrode CE may be disposed to overlap one of the first to third emission areas LA1, LA2, and LA3 defined by the second bank BNK2. The second electrode CE may be a cathode electrode of the light emitting element EL, but the disclosure is not limited thereto.

The light emitting diode ED may be disposed between the first electrode AE and the second electrode CE on the first planarization layer OC1. One end (or a first end) of the light emitting diode ED may be electrically connected to the first electrode AE, and the other end (or a second end) of the light emitting diode ED may be electrically connected to the second electrode CE. For example, light emitting diodes ED may include active layers having the same material and emit light of the same wavelength band or light of the same color. Light emitted from each of the first to third emission areas LA1, LA2, and LA3 may have the same color. For example, the light emitting diodes ED may emit the third color light or blue light having a peak wavelength in a range of about 440 nm to about 480 nm. Therefore, the light emitting element layer EML may emit the third color light or blue light.

The second bank BNK2 may be disposed in the light blocking area BA on the first planarization layer OC1. The second bank BNK2 may define the first to third emission areas LA1, LA2, and LA3. For example, the second bank BNK2 may surround each of the first to third emission areas LA1, LA2, and LA3, but the disclosure is not limited thereto. The second bank BNK2 may separate and insulate the first electrode AE or the second electrode CE of each of light emitting elements EL.

The second passivation layer PAS2 may be disposed on the light emitting elements EL and the second bank BNK2. The second passivation layer PAS2 may cover (or overlap) the light emitting elements EL and may protect the light emitting elements EL. The second passivation layer PAS2 may prevent infiltration of impurities such as moisture or air from the outside to prevent damage to the light emitting elements EL.

The second planarization layer may be provided on the second passivation layer PAS2 to planarize a top portion of the light emitting element layer EML. For example, the second planarization layer may include an organic material.

The filler FIL may fill the space between the light emitting element layer EML and the wavelength conversion layer WLCL and be surrounded by the sealing part AM. For example, the filler FIL may be made of an organic material allowing light to pass therethrough. The filler FIL may be made of a silicon (or silicon-based) organic material or an epoxy (or epoxy-based) organic material, or the like, but the disclosure is not limited thereto. As another example, the filler FIL may be omitted.

The sealing part AM may be disposed between the edge of the first substrate SUB1 and the edge of the second substrate SUB2 in the non-display area NDA. The sealing part AM may be disposed along the edges of the first substrate SUB1 and the second substrate SUB2 in the non-display area NDA to seal the filler FIL. The sealing part AM may bond the first substrate SUB1 and the second substrate SUB2. For example, the sealing part AM may include an organic material. The sealing part AM may be made of an epoxy-based resin, but the disclosure is not limited thereto.

The wavelength conversion layer WLCL may be disposed between the sealing parts AM. The wavelength conversion layer WLCL may include a second light blocking member BK2, a first wavelength conversion part WLC1, a second wavelength conversion part WLC2, a light transmission part LTU, and a second capping layer CAP2.

The second light blocking member BK2 may be disposed in the light blocking area BA on the second capping layer CAP2. The second light blocking member BK2 may overlap the second bank BNK2 in the thickness direction. The second light blocking member BK2 may block transmission of light. The second light blocking member BK2 may prevent light infiltration and color mixture between the first to third emission areas LA1, LA2, and LA3, thereby improving color reproducibility of the display device 10. The second light blocking member BK2 may be arranged in the form of a grid surrounding the first to third emission areas LA1, LA2, and LA3 in a plan view.

The first wavelength conversion part WLC1 may be disposed in the first emission area LA1 on the second capping layer CAP2. The first wavelength conversion part WLC1 may be surrounded by the second light blocking member BK2. The first wavelength conversion part WLC1 may include a first based resin BS1, a first scatterer SCT1, and a first wavelength shifter WLS1.

The first base resin BS1 may contain a material having a relatively high light transmittance. The first base resin BS1 may be formed of a transparent organic material. For example, the first base resin BS1 may contain at least one of organic materials such as epoxy-based resin, acrylic-based resin, cardo-based resin, and imide-based resin.

The first scatterer SCT1 and the first base resin BS1 may have different refractive indexes and form an optical interface. For example, the first scatterer SCT1 may contain a light scattering material or light scattering particles that scatter at least a part of transmitted light. For example, the first scatterer SCT1 may contain a metallic oxide such as titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$), or may contain organic particles such as acrylic-based resin and urethane-based resin. The first scatterer SCT1 may scatter incident light in random directions regardless of the incidence direction of the incident light without any substantial changes in the peak wavelength of the incident light.

The first wavelength shifter WLS1 may change or shift the peak wavelength of the incident light to a first peak wavelength. For example, the first wavelength shifter WLS1 may convert blue light provided from the display device 10 into red light having a single peak wavelength in a range of about 610 nm to about 650 nm and emit the red light. The first wavelength shifter WLS1 may be a quantum dot, a quantum rod, or a fluorescent substance. The quantum dot may be a particulate material that emits light of a specific color in case that an electron transitions from a conduction band to a valence band.

A part of the blue light emitted from the light emitting element layer EML may pass through the first wavelength conversion part WLC1 without being converted to red light by the first wavelength shifter WLS1. As a part of the blue light emitted from the light emitting element layer EML, the light incident on a first color filter CF1 without being converted by the first wavelength conversion part WLC1 may be blocked by the first color filter CF1. The red light produced by the first wavelength conversion part WLC1 converting the blue light emitted from the light emitting element layer EML may pass through the first color filter CF1 and be emitted to the outside. Accordingly, the red light may be emitted through the first emission area LA1.

The second wavelength conversion part WLC2 may be disposed in the second emission area LA2 on the second capping layer CAP2. The second wavelength conversion part WLC2 may be surrounded by the second light blocking member BK2. The second wavelength conversion part WLC2 may include a second base resin BS2, a second scatterer SCT2, and a second wavelength shifter WLS2.

The second base resin BS2 may contain a material having a relatively high light transmittance. The second base resin BS2 may be formed of a transparent organic material. For example, the second base resin BS2 and the first base resin BS1 may be made of (or include) the same material, or the second base resin BS2 may be made of the material that may form the first base resin BS1.

The second scatterer SCT2 and the second base resin BS2 may have different refractive indexes and form an optical interface. For example, the second scatterer SCT2 may contain a light scattering material or light scattering particles scattering at least a part of transmitted light. For example, the second scatterer SCT2 and the first scatterer SCT1 may be made of the same material, or the second scatterer SCT2 may be made of the material that may form the first scatterer SCT1.

The second wavelength shifter WLS2 may change or shift the peak wavelength of the incident light to a second peak wavelength different from the first peak wavelength of the first wavelength shifter WLS1. For example, the second wavelength shifter WLS2 may convert blue light provided from the display device 10 into green light having a single peak wavelength in a range of about 510 nm to about 550 nm and emit the green light. The second wavelength shifter WLS2 may be a quantum dot, a quantum rod, or a fluorescent substance. The second wavelength shifter WLS2 may contain the materials identical in purpose with the materials that may form the first wavelength shifter WLS1. The second wavelength shifter WLS2 may be formed of a quantum dot, a quantum rod, or a fluorescent substance to have a wavelength conversion range different from that of the first wavelength shifter WLS1.

The light transmission part LTU may be disposed in the third emission area LA3 on the second capping layer CAP2. The light transmission part LTU may be surrounded by the second light blocking member BK2. The light transmission part LTU may allow the incident light to pass therethrough while maintaining the peak wavelength of the light. The light transmission part LTU may include a third base resin BS3 and a third scatterer SCT3.

The third base resin BS3 may contain a material having a relatively high light transmittance. The third base resin BS3 may be formed of a transparent organic material. For example, the third base resin BS3 and the first base resin BS1 or the second base resin BS2 may be made of (or include) the same material, or the third base resin BS3 may be made of the material that may form the first base resin BS1 or the second base resin BS2.

The third scatterer SCT3 and the third base resin BS3 may have different refractive indexes and form an optical interface. For example, the third scatterer SCT3 may contain a light scattering material or light scattering particles scattering at least a part of the transmitted light. For example, the third scatterer SCT3 and the first scatterer SCT1 or the second scatterer SCT2 may be formed of the same material, or the third scatterer SCT3 may be made of (or include) the material that may form the first scatterer SCT1 or the second scatterer SCT2.

The second capping layer CAP2 may cover (or overlap) the bottom surfaces of the first and second wavelength conversion parts WLC1 and WLC2, the light transmission part LTU, and a first light blocking member BK1. For example, the second capping layer CAP2 may seal the first and second wavelength conversion parts WLC1 and WLC2 and the light transmission part LTU to prevent the first and second wavelength conversion parts WLC1 and WLC2 and the light transmission part LTU from damage or contamination. For example, the second capping layer CAP2 may include an inorganic material.

The color filter layer CFL may include a first capping layer CAP1, a first light blocking member BK1, and first to third color filters CF1, CF2 and CF3.

The first capping layer CAP1 may be disposed on the wavelength conversion layer WLCL. The first capping layer CAP1 may seal the bottom surface of the first to third color filters CF1, CF2 and CF3. For example, the first capping layer CAP1 may include an inorganic material.

The first light blocking member BK1 may be disposed in the light blocking area BA below the second substrate SUB2. The first light blocking member BK1 may overlap the second light blocking member BK2 or the second bank BNK2 in the thickness direction. The first light blocking member BK1 may block transmission of light. The first light blocking member BK1 may prevent light infiltration and color mixture between the first to third emission areas LA1, LA2, and LA3, thereby improving color reproducibility of the display device 10. The first light blocking member BK1 may be arranged in the form of a grid surrounding the first to third emission areas LA1, LA2, and LA3 in a plan view.

The first color filter CF1 may be disposed in the first emission area LA1 below the second substrate SUB2. The first color filter CF1 may be surrounded by the first light blocking member BK1. The first color filter CF1 may overlap the first wavelength conversion part WLC1 in the thickness direction. The first color filter CF1 may selectively allow the first color light (e.g., red light) to pass therethrough, and block or absorb the second color light (e.g., green light) and the third color light (e.g., blue light). For example, the first color filter CF1 may be a red color filter and contain a red colorant.

The second color filter CF2 may be disposed in the second emission area LA2 below the second substrate SUB2. The second color filter CF2 may be surrounded by the first light blocking member BK1. The second color filter CF2 may overlap the second wavelength conversion part WLC2 in the thickness direction. The second color filter CF2 may selectively allow the second color light (e.g., green light) to pass therethrough, and block or absorb the first color light (e.g., red light) and the third color light (e.g., blue light). For example, the second color filter CF2 may be a green color filter and contain a green colorant.

The third color filter CF3 may be disposed in the third emission area LA3 below the second substrate SUB2. The third color filter CF3 may be surrounded by the first light blocking member BK1. The third color filter CF3 may overlap the light transmission part LTU in the thickness direction. The third color filter CF3 may selectively allow the third color light (e.g., blue light) to pass therethrough, and block or absorb the first color light (e.g., red light) and the second color light (e.g., green light). For example, the third color filter CF3 may be a blue color filter and contain a blue colorant.

The first to third color filters CF1, CF2, and CF3 may absorb a part of the light coming from the outside of the display device 10 to reduce the reflected light of the external light. This means that the first to third color filters CF1, CF2, and CF3 can prevent color distortion caused by the reflection of the external light.

The second substrate SUB2 may be disposed on the color filter layer CFL. The second substrate SUB2 may support and protect the display device 10. The second substrate SUB2 may be a base substrate and may be made of an insulating material such as polymer resin. For example, the second substrate SUB2 may be a rigid substrate. In case that the second substrate SUB2 is a rigid substrate, the second substrate SUB2 may include a glass material or a metal material, but the disclosure is not limited thereto. As another example, the second substrate SUB2 may be a flexible substrate which can be bent, folded, and rolled. In case that the second substrate SUB2 is a flexible substrate, the second substrate SUB2 may include polyimide (PI), but the disclosure is not limited thereto.

The metal line GNL may be disposed in the non-display area NDA on the thin film transistor layer TFTL. The metal line GNL may extend along at least one edge of the first substrate SUB1. The metal line GNL may be covered (or overlapped or overlapping) by the sealing part AM. For example, the metal line GNL may be disposed on the first passivation layer PAS1, but the disclosure is not limited thereto. The metal line GNL may pass through the non-display area NDA to be electrically connected to the ground pad portion (not shown) disposed on a first side of the first substrate SUB1. The metal line GNL may be inserted in a contact hole penetrating the first passivation layer PAS1, the interlayer insulating layer ILD, the gate insulating layer GI, and the buffer layer BF to be connected to the light blocking layer BML.

The metal line GNL may be grounded by a specific voltage through the ground pad portion. The metal line GNL may be grounded so that the static electricity introduced from the outside may be induced to the exterior of the display device 10. The metal line GNL may prevent the static electricity introduced from the outside from entering the display layer DPL.

The antistatic member ESD may be disposed between the first substrate SUB1 and the second substrate SUB2 in the non-display area NDA. One end (or first end) of the antistatic member ESD may be exposed to face the outside of the display device 10, and the other end (or second end) of the antistatic member ESD may be electrically connected to the metal line GNL. The antistatic member ESD may release a part of the static electricity introduced from the outside and may induce the other part of the static electricity to the metal line GNL. For example, the amount of the static electricity released by the antistatic member ESD may be significantly greater than the amount of the static electricity induced to the metal line GNL. Accordingly, the antistatic member ESD may prevent the static electricity from entering the display layer DPL by inducing only a fine amount of static electricity to the metal line GNL.

The antistatic member ESD may include a support SPT, a first receiver RCV1, a second receiver RCV2, and an insertion part IST.

The support SPT may be disposed on the metal line GNL to be supported by the metal line GNL and may support the first and second receivers RCV1 and RCV2. The support SPT may extend from the top of the metal line GNL to the bottom of the second substrate SUB2. For example, the support SPT may extend along at least one edge of the first substrate SUB1 with the metal line GNL. The support SPT may be covered by the sealing part AM.

The first receiver RCV1 may protrude from the top of the support SPT to the exterior of the sealing part AM. The first receiver RCV1 may protrude toward the outside of the first substrate SUB1. The end of the first receiver RCV1 may be parallel to the end of the first substrate SUB1 or the end of the second substrate SUB2, but the disclosure is not limited thereto. A part of the first receiver RCV1 may be connected to the support SPT to be covered by the sealing part AM, and another part thereof may protrude from the sealing part AM. The first receiver RCV1 may be a metal plate extending along at least one edge of the first substrate SUB1. For example, the first receiver RCV1 may contact the bottom surface of the color filter layer CFL or the wavelength conversion layer WLCL, but the disclosure is not limited thereto. As another example, the first receiver RCV1 may be spaced apart by a predetermined distance from the bottom surface of the color filter layer CFL or the wavelength conversion layer WLCL.

The second receiver RCV2 may protrude from below the support SPT to the exterior of the sealing part AM. The second receiver RCV2 may protrude toward the outside of the first substrate SUB1. The second receiver RCV2 may protrude in a direction parallel to the first receiver RCV1. The end of the second receiver RCV2 may be parallel to the end of the first receiver RCV1, the end of the first substrate SUB1, or the end of the second substrate SUB2, but the disclosure is not limited thereto. A part of the second receiver RCV2 may be connected to the support SPT to be covered by the sealing part AM, and another part thereof may protrude from the sealing part AM. The second receiver RCV2 may be a metal plate extending along at least one edge of the first substrate SUB1. The second receiver RCV2 may be spaced apart by a predetermined distance from the first receiver RCV1. The first and second receivers RCV1 and RCV2 may face each other to form a capacitor.

The insertion part IST may protrude from a lower end of the support SPT toward the metal line GNL. The insertion part IST may be inserted into contact holes CNT of the metal line GNL to be electrically connected to the metal line GNL.

Figure 4:
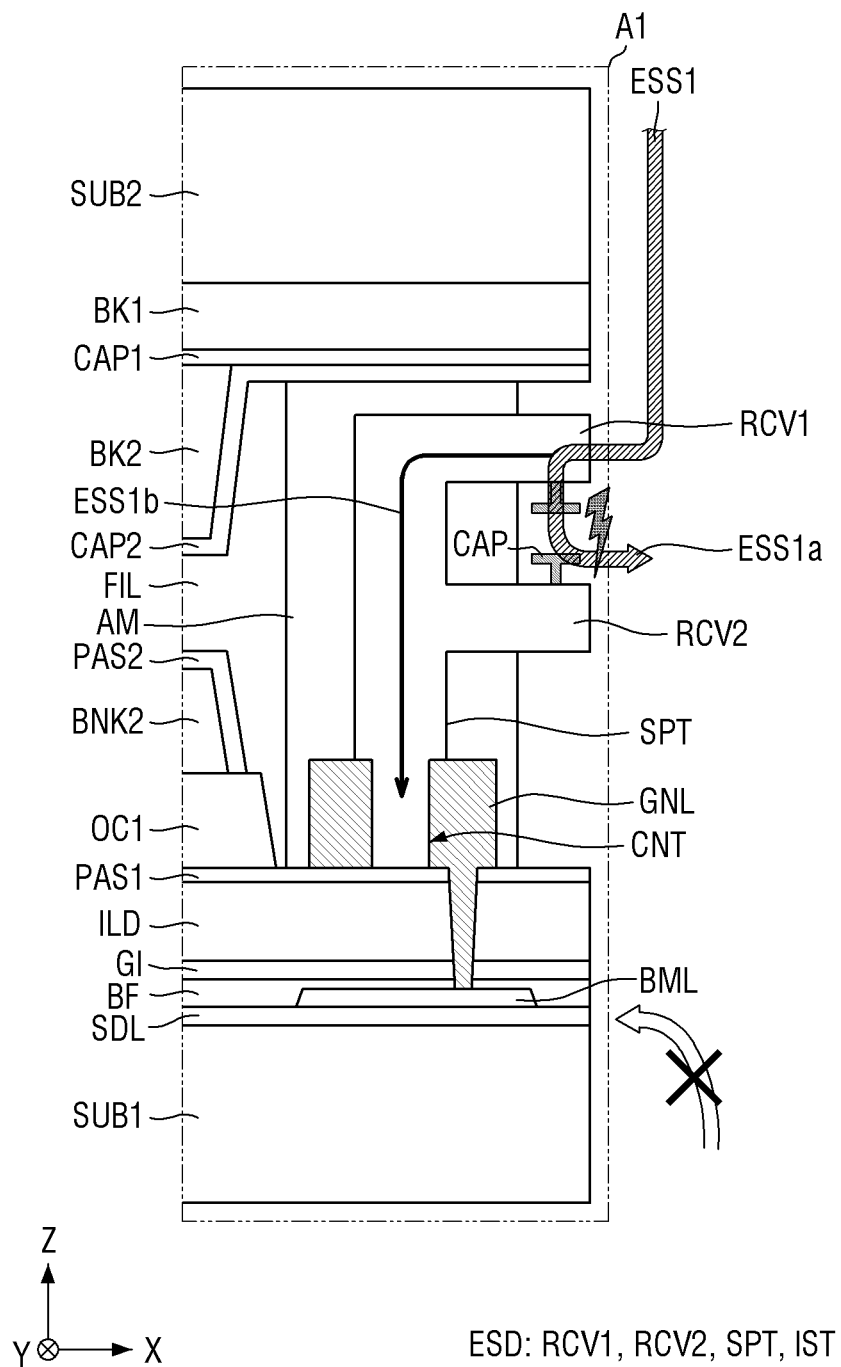
FIG. 4 is an enlarged view of area A1 of FIG. 3 schematically illustrating an example of an electrostatic release process.
Figure 5:
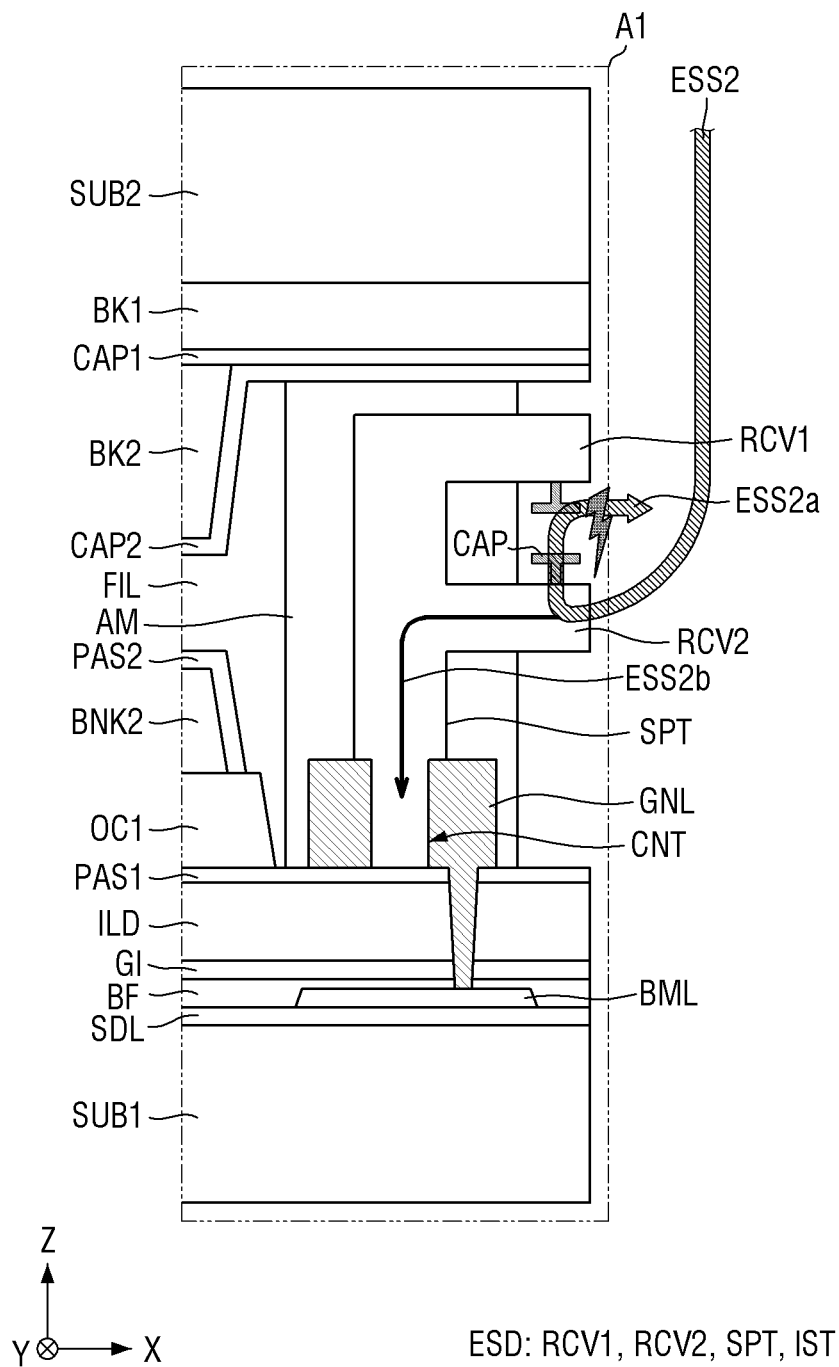
FIG. 5 is an enlarged view of area A1 of FIG. 3 schematically illustrating another example of an electrostatic release process.

FIG. 4 is a schematic enlarged view of area A1 of FIG. 3 illustrating an example of an electrostatic release process, and FIG. 5 is a schematic enlarged view of area A1 of FIG. 3 illustrating another example of an electrostatic release process.

Referring to FIGS. 4 and 5, the antistatic member ESD may be disposed between the first substrate SUB1 and the second substrate SUB2 in the non-display area NDA. One end (or first end) of the antistatic member ESD may be exposed to the outside of the display device 10, and the (or second end) of the antistatic member ESD may be electrically connected to the metal line GNL. The antistatic member ESD may release a part of the static electricity introduced from the outside and may induce the other part of the static electricity to the metal line GNL. For example, the amount of the static electricity released by the antistatic member ESD may be significantly greater than the amount of the static electricity guided toward the metal line GNL. Accordingly, the antistatic member ESD may prevent the static electricity from entering the display layer DPL by inducing only a fine amount of static electricity to the metal line GNL.

In FIG. 4, first electrostatic energy ESS1 may be introduced to the first receiver RCV1 of the antistatic member ESD. A part ESS1$a$ of the first electrostatic energy ESS1 may be consumed by being discharged by a capacitor CAP formed between the first and second receivers RCV1 and RCV2. Accordingly, the antistatic member ESD may release a part ESS1$a$ of the first electrostatic energy ESS1 through the capacitor CAP.

Another part ESS1$b$ of the first electrostatic energy ESS1 may be induced to the metal line GNL through the support SPT and the insertion part IST. The other part ESS1$b$ of the first electrostatic energy ESS1 may flow along the metal line GNL and may be discharged to the outside of the display device 10 through the ground pad portion. For example, the amount of the electrostatic energy ESS1$a$ released by the antistatic member ESD may be significantly greater than the amount of the electrostatic energy ESS1$b$ induced by the metal line GNL (ESS1$a$>>ESS1$b$). Accordingly, the antistatic member ESD may induce only a fine amount of the electrostatic energy ESS1$b$ to the metal line GNL to prevent the static electricity from entering inside the display layer DPL.

As illustrated in FIG. 5, second electrostatic energy ESS2 may be introduced to the second receiver RCV2 of the antistatic member ESD. A part ESS2$a$ of the second electrostatic energy ESS2 may be consumed by being discharged by a capacitor CAP formed between the first and second receivers RCV1 and RCV2. Accordingly, the antistatic member ESD may release a part ESS2$a$ of the second electrostatic energy ESS2 through the capacitor CAP.

Another part ESS2$b$ of the second electrostatic energy ESS2 may be induced to the metal line GNL by the support SPT and the insertion part IST. The other part ESS2$b$ of the second electrostatic energy ESS2 may flow along the metal line GNL and may be discharged to the outside of the display device 10 through the ground pad portion. For example, the amount of the electrostatic energy ESS2$a$ released by the antistatic member ESD may be significantly greater than the amount of the electrostatic energy ESS2$b$ induced to the metal line GNL (ESS2$a$>>ESS2$b$). Accordingly, the antistatic member ESD may induce only a fine amount of the electrostatic energy ESS2$b$ to the metal line GNL to prevent the electrostatic energy from entering the display layer DPL. The display device 10 may improve the static electricity reception sensitivity in the non-display area NDA to prevent the electrostatic energy from entering the display layer DPL, thereby preventing a defect of the display device 10 to improve the reliability of the display device 10.

Figure 6:
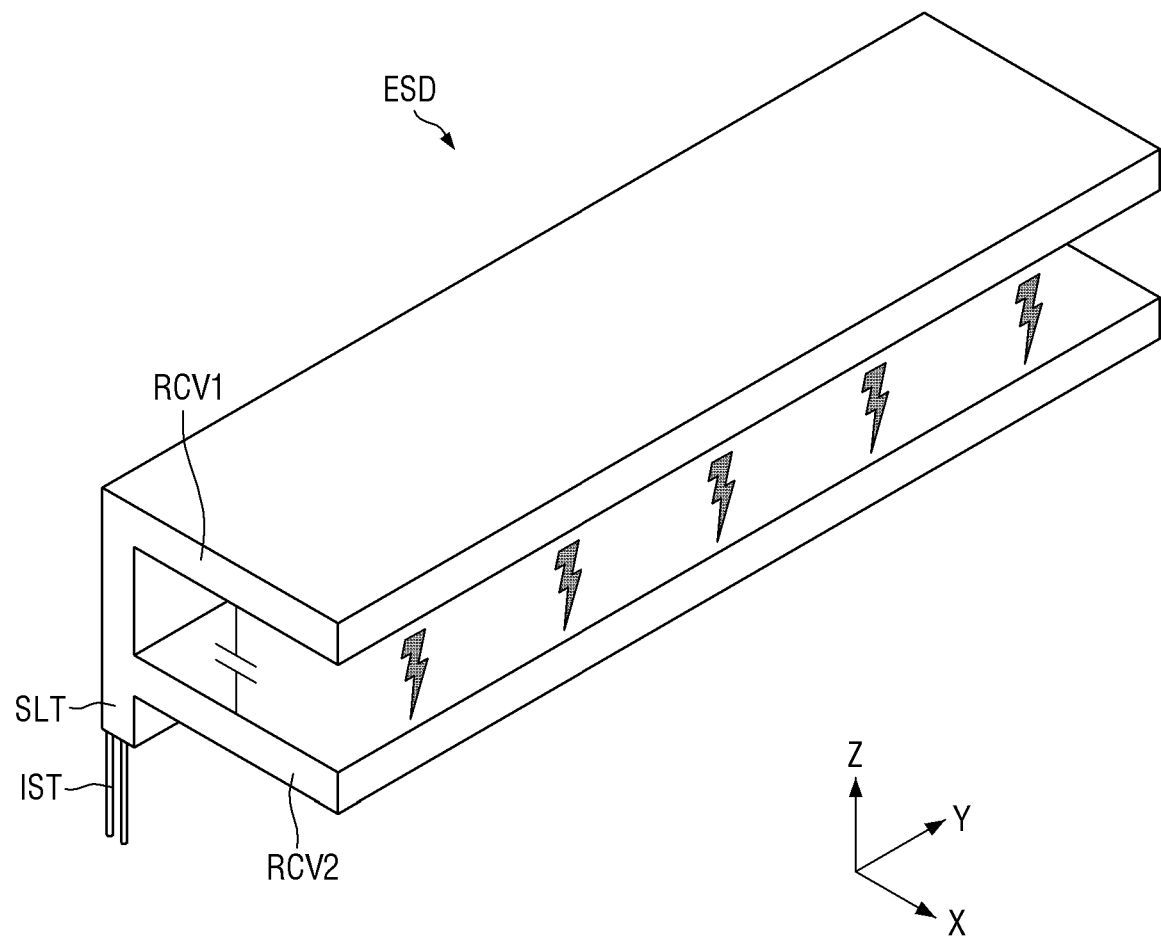
FIG. 6 is a perspective view schematically illustrating an antistatic member in the display device of FIG. 3.
Figure 7:
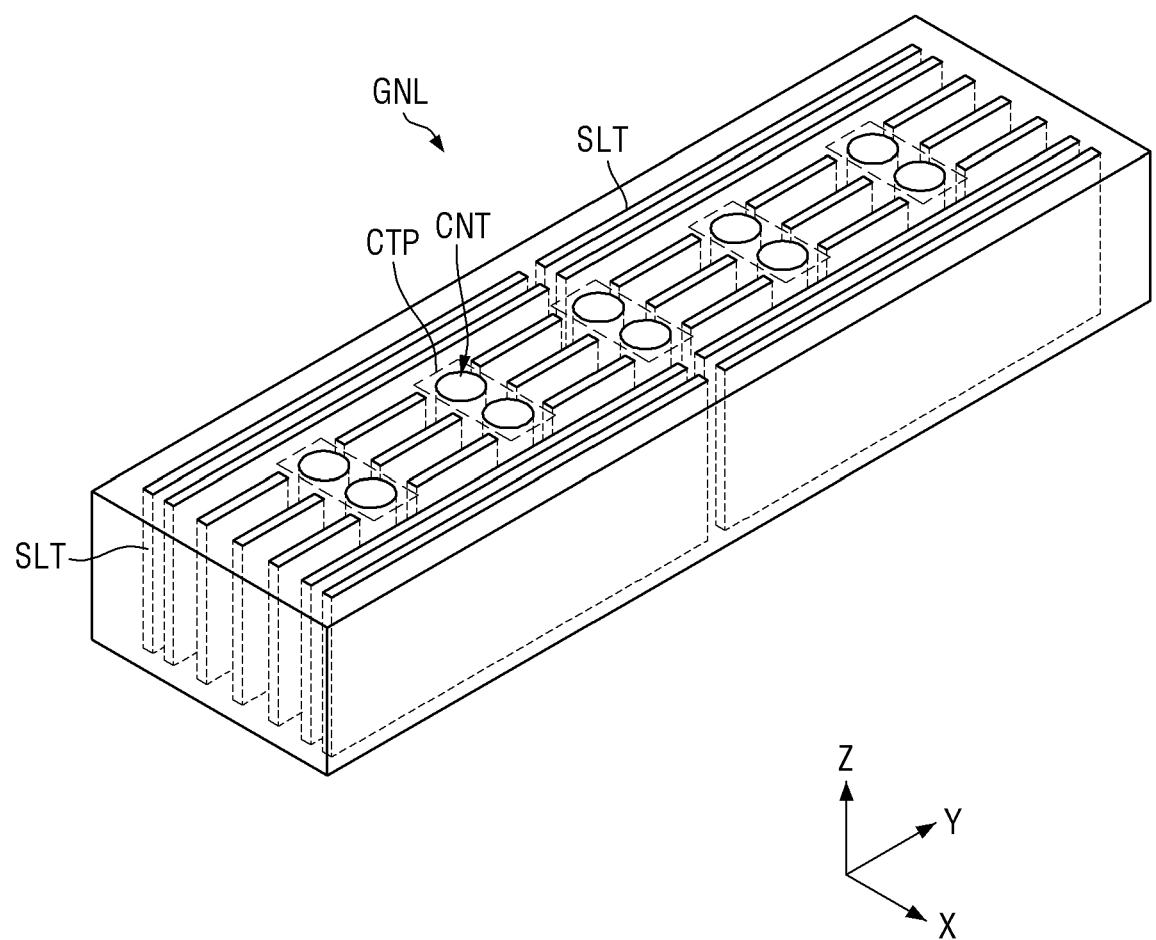
FIG. 7 is a perspective view schematically illustrating a metal line in the display device of FIG. 3.
Figure 8:
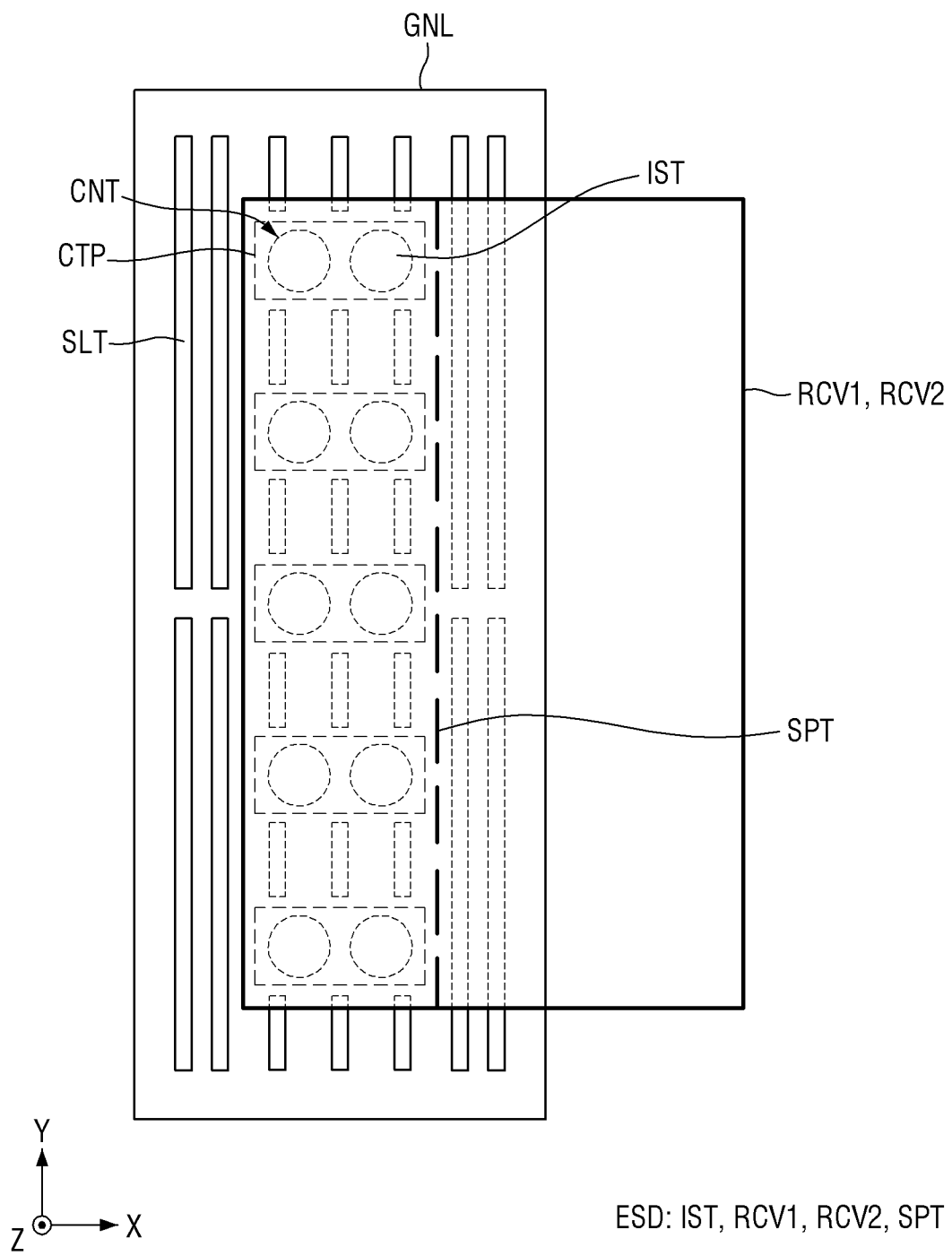
FIG. 8 is a plan view schematically illustrating a connection relationship of the antistatic member and the metal line in the display device of FIG. 3.

FIG. 6 is a schematic perspective view illustrating the antistatic member in the display device of FIG. 3, FIG. 7 is a schematic perspective view illustrating the metal line in the display device of FIG. 3, and FIG. 8 is a schematic plan view illustrating a connection relationship of the antistatic member and the metal line in the display device of FIG. 3.

Referring to FIGS. 6 to 8, the antistatic member ESD may include the support SPT, the first receiver RCV1, the second receiver RCV2, and the insertion part IST.

The support SPT may be disposed on the metal line GNL to be supported by the metal line GNL and may support the first and second receivers RCV1 and RCV2. The support SPT may extend from the top of the metal line GNL to the bottom of the second substrate SUB2. For example, the support SPT may extend along at least one edge of the first substrate SUB1 with the metal line GNL.

The first receiver RCV1 may protrude from the top of the support SPT toward the outside of the first substrate SUB1. The end of the first receiver RCV1 may be parallel to the end of the first substrate SUB1 or the end of the second substrate SUB2, but the disclosure is not limited thereto. The first receiver RCV1 may be a metal plate extending along at least one edge of the first substrate SUB1.

The second receiver RCV2 may protrude from below the support SPT toward the outside of the first substrate SUB1. The second receiver RCV2 may protrude in a direction parallel to the first receiver RCV1. The end of the second receiver RCV2 may be parallel to the end of the first receiver RCV1, the end of the first substrate SUB1, or the end of the second substrate SUB2, but the disclosure is not limited thereto. The second receiver RCV2 may be a metal plate extending along at least one edge of the first substrate SUB1. The second receiver RCV2 may be spaced apart by a predetermined distance from the first receiver RCV1. The capacitor CAP may be formed by the first and second receivers RCV1 and RCV2 facing each other.

The insertion part IST may protrude from the lower end of the support SPT toward the metal line GNL. The insertion part IST may be inserted into the contact holes CNT of the metal line GNL to be electrically connected to the metal line GNL.

The metal line GNL may include a pad portion CTP and slits SLT.

The pad portion CTP may include the contact holes CNT to be electrically connected to the antistatic member ESD. The pad portion CTP may be electrically connected to the antistatic member ESD by the insertion part IST inserted into the contact holes CNT. The pad portion CTP may be surrounded by the slits SLT.

The slits SLT may extend in the extending direction of the metal line GNL. For example, the slits SLT may extend in the second direction (e.g., the Y-axis direction) and be spaced apart from each other in the first direction (e.g., the X-axis direction). The slits SLT may be spaced apart from each other by the pad portion CTP. The metal line GNL may not have the slits SLT in the area of the pad portion CTP to minimize the contact resistance between the pad portion CTP and the antistatic member ESD. The slits SLT may penetrate at least one part of the metal line GNL in the thickness direction (e.g., the Z-axis direction) to adjust the resistance of the metal line GNL.

Figure 9:
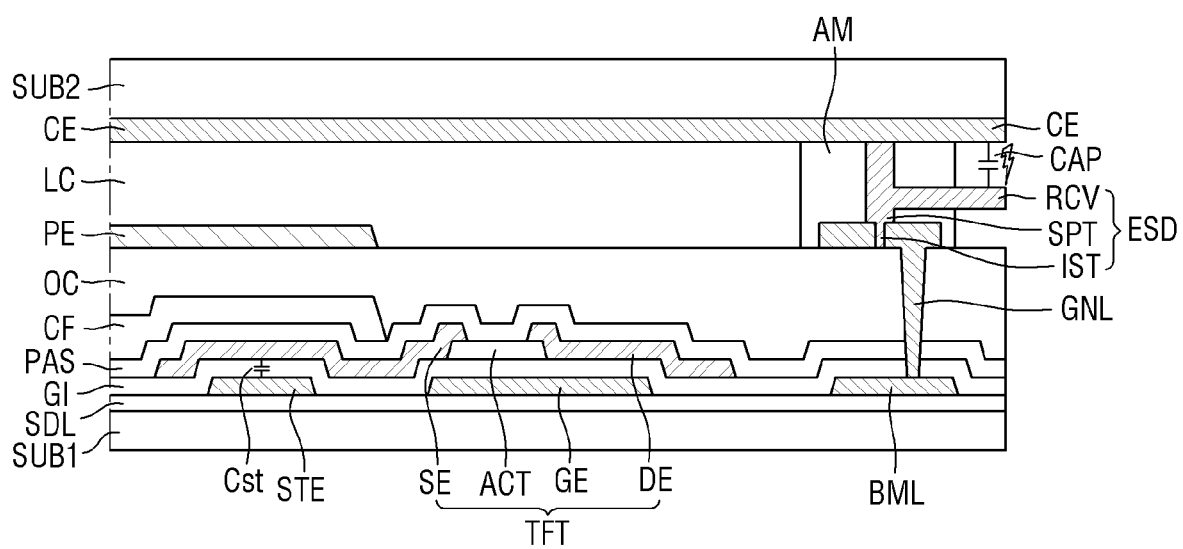
FIG. 9 is a schematic cross-sectional view of another example taken along line I-I' of FIG. 2.

FIG. 9 is a schematic cross-sectional view of another example taken along line I-I' of FIG. 2.

Referring to FIG. 9, the display device 10 may include the first substrate SUB1, the substrate insulating layer SDL, the thin film transistor TFT, a storage electrode STE, the gate insulating layer GI, a passivation layer PAS, a color filter CF, a planarization layer OC, a pixel electrode PE, a liquid crystal layer LC, a common electrode CE, and the second substrate SUB2.

The first substrate SUB1 may be a base substrate and may be made of an insulating material such as polymer resin. For example, the first substrate SUB1 may include a glass material or a metal material, but the disclosure is not limited thereto.

The substrate insulating layer SDL may directly cover (or overlap) the top surface of the first substrate SUB1. The substrate insulating layer SDL may be disposed between the first substrate SUB1 and the thin film transistor layer TFTL. The substrate insulating layer SDL may be formed before the thin film transistor layer TFTL is stacked on the first substrate SUB1 to insulate the top surface of the first substrate SUB1. The substrate insulating layer SDL may prevent a metal material from being directly disposed on the first substrate SUB1. Accordingly, the substrate insulating layer SDL may prevent the static electricity from being introduced along the top surface of the first substrate SUB1. For example, the substrate insulating layer SDL may contain at least one of silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride.

The thin film transistor TFT may be disposed on the substrate insulating layer SDL and may form a pixel circuit of each of pixels. For example, the thin film transistor TFT may be a switching or driving transistor of the pixel circuit. The thin film transistor TFT may include a semiconductor region ACT, a gate electrode GE, a drain electrode DE, and a source electrode SE.

The gate electrode GE may be disposed on the substrate insulating layer SDL. The gate electrode GE may overlap the semiconductor region ACT with the gate insulating layer GI interposed therebetween.

The storage electrode STE may be disposed on the substrate insulating layer SDL. The storage electrode STE and the source electrode SE may face each other to be spaced apart from each other. The storage electrode STE and the source electrode SE may form a storage capacitor Cst.

The gate insulating layer GI may cover (or overlap) the gate electrode GE, the storage electrode STE, and the substrate insulating layer SDL.

The semiconductor region ACT, the drain electrode DE, and the source electrode SE may be disposed on the gate insulating layer GI. The semiconductor region ACT may overlap the gate electrode GE in the thickness direction and may be insulated from the gate electrode GE by the gate insulating layer GI. The drain electrode DE can cover (or overlap) an end of the semiconductor region ACT, and the source electrode SE may cover another end of the semiconductor region ACT. The source electrode SE of the thin film transistor TFT may be electrically connected to the pixel electrode PE and may receive a data voltage in case that the thin film transistor TFT is turned on.

The passivation layer PAS may be disposed on the semiconductor region ACT, the drain electrode DE, and the source electrode SE to protect the thin film transistor TFT.

The color filter CF may be disposed on the passivation layer PAS to overlap the pixel electrode PE. The color filter CF may provide a specific color to transmitted light. The color filter CF may include first to third color filters that transmit light in different colors. For example, each of the first to third color filters may be one of a red color filter, a green color filter, and a blue color filter.

The planarization layer OC may cover (or overlap) the color filter CF and the passivation layer PAS and may planarize a top portion of the first substrate SUB1.

The pixel electrode PE may be disposed on the planarization layer OC. The pixel electrode PE may be electrically connected to the source electrode SE of the thin film transistor TFT. The pixel electrode PE may face the common electrode CE on the second substrate SUB2.

The liquid crystal layer LC may be filled between the first substrate SUB1 and the second substrate SUB2. The liquid crystal layer LC may be disposed between the pixel electrode PE and the common electrode CE. The liquid crystal capacitor may be formed between the pixel electrode PE and the common electrode CE to maintain the voltage between the pixel electrode PE and the common electrode CE. Accordingly, the liquid crystal layer LC may change the transmittance of light transmitting the liquid crystal layer LC by changing the arrangement according to the voltage difference between the pixel electrode PE and the common electrode CE.

The common electrode CE may be disposed on the second substrate SUB2. The second substrate SUB2 and the first substrate SUB1 are bonded, so that the common electrode CE on the second substrate SUB2 and the pixel electrode PE on the first substrate SUB1 may face each other.

The sealing part AM may be disposed between the edge of the first substrate SUB1 and the edge of the second substrate SUB2. The sealing part AM may be arranged along the edges of the first substrate SUB1 and the second substrate SUB2 to seal the liquid crystal layer LC. The sealing part AM may bond the first substrate SUB1 and the second substrate SUB2. For example, the sealing part AM may include an organic material. The sealing part AM may be made of an epoxy-based resin, but the disclosure is not limited thereto.

The metal line GNL may be disposed at the edge on the first substrate SUB1. The metal line GNL may be covered by the sealing part AM. For example, the metal line GNL may be disposed on the planarization layer OC, but the disclosure is not limited thereto. The metal line GNL may pass through the edge on the first substrate SUB1 to be electrically connected to the ground pad portion (not shown) disposed on a side of the first substrate SUB1.

The metal line GNL may be grounded by a specific voltage through the ground pad portion. The metal line GNL may be grounded so that the static electricity introduced from the outside may be induced to the exterior of the display device 10. The metal line GNL may prevent the static electricity, introduced from the outside, from entering the display layer.

The antistatic member ESD may be disposed between the edge of the first substrate SUB1 and the edge of the second substrate SUB2. One end (or first end) of the antistatic member ESD may be exposed to face the outside of the display device 10 and the other end (or second end) of the antistatic member ESD may be electrically connected to the metal line GNL. The antistatic member ESD may release a part of the static electricity introduced from the outside and may induce another part of the static electricity to the metal line GNL. For example, the amount of the static electricity released by the antistatic member ESD may be significantly greater than the amount of the static electricity induced to the metal line GNL. Accordingly, the antistatic member ESD may prevent the static electricity from entering the display layer by inducing only a fine amount of static electricity to the metal line GNL. The display device 10 may prevent the static electricity from entering the display layer, thereby improving electrostatic discharge sensitivity, and may prevent a defect of the display device 10, thereby improving the reliability of the display device 10.

The antistatic member ESD may include the support SPT, a receiver RCV, and the insertion part IST.

The support SPT may be disposed on the metal line GNL to be supported by the metal line GNL and may support the receiver RCV. The support SPT may extend from the top of the metal line GNL to the bottom of the common electrode CE. For example, the support SPT may extend along at least one edge of the first substrate SUB1 with the metal line GNL. The support SPT may be covered by the sealing part AM.

The receiver RCV may protrude from the bottom of the support SPT to the exterior of the sealing part AM. The receiver RCV may protrude toward the outside of the first substrate SUB1. An end of the receiver RCV may be parallel to an end of the common electrode CE, the end of the first substrate SUB1, or the end of the second substrate SUB2, but the disclosure is not limited thereto. A part of the receiver RCV may be connected to the support SPT to be covered by the sealing part AM, and another part thereof may protrude from the sealing part AM. The receiver RCV may be a metal plate extending along at least one edge of the first substrate SUB1. The receiver RCV may be spaced apart by a predetermined distance from the common electrode CE. The capacitor CAP may be formed by the common electrode CE and the receiver RCV facing each other.

The insertion part IST may protrude from the lower end of the support SPT toward the metal line GNL. The insertion part IST may be inserted into the contact holes CNT of the metal line GNL to be connected to the metal line GNL.

Figure 10:
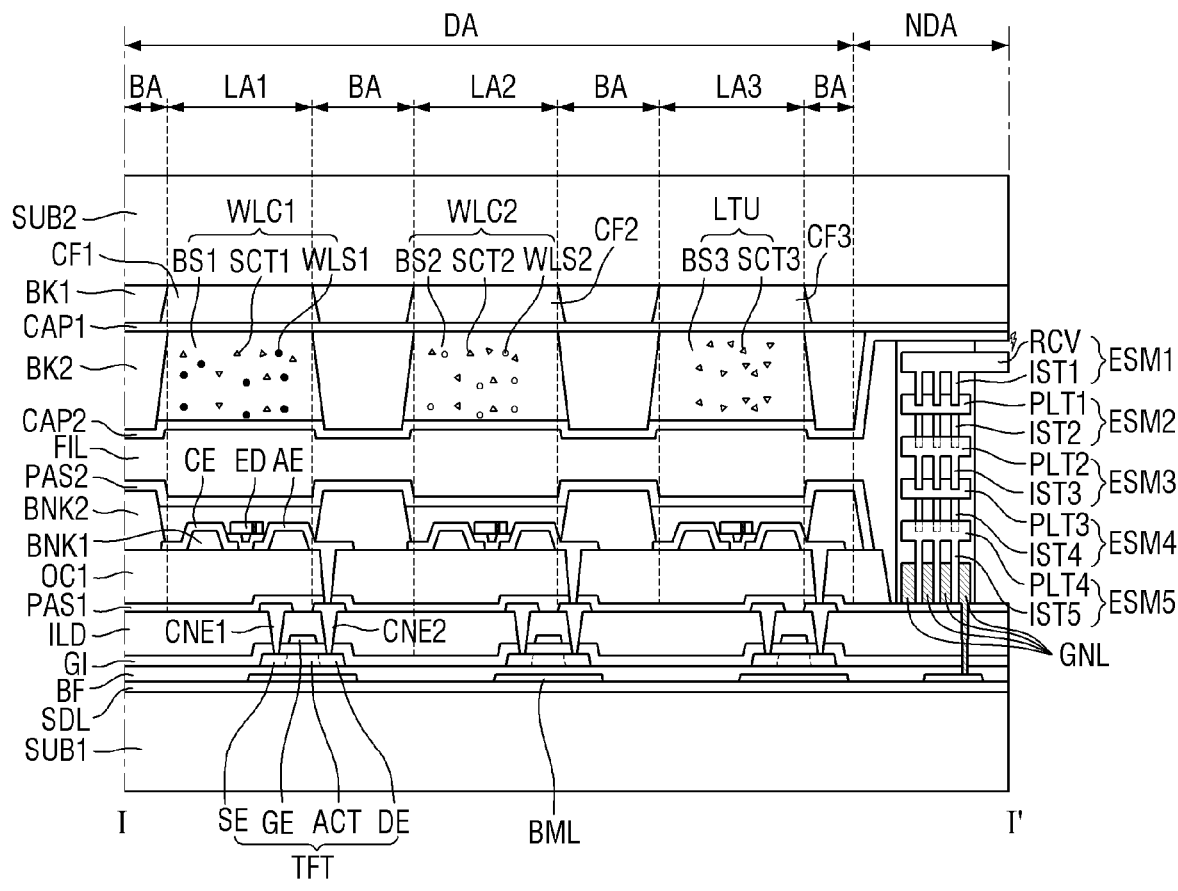
FIG. 10 is a schematic cross-sectional view of still another example taken along line I-I' of FIG. 2.
Figure 11:
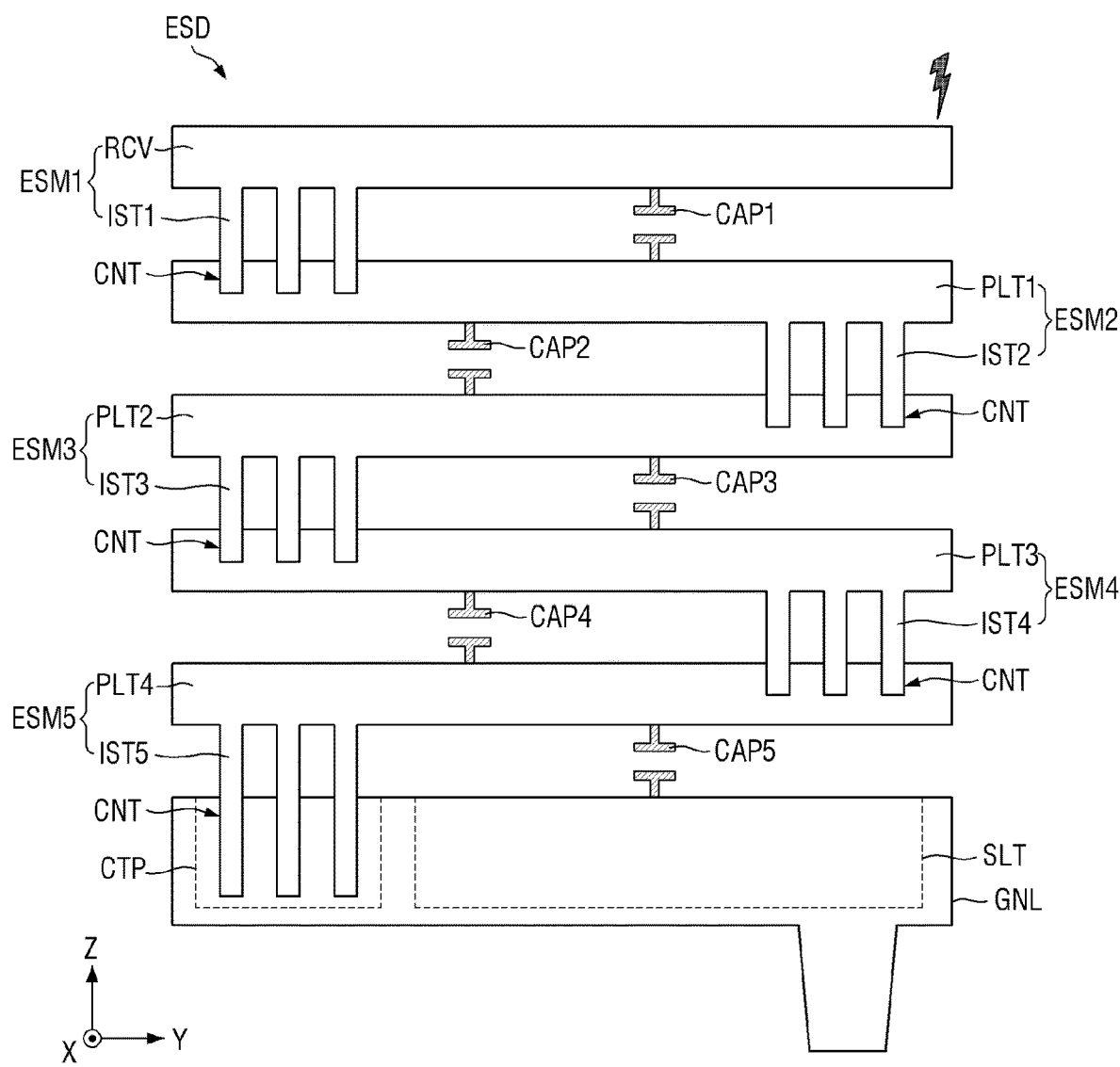
FIG. 11 is a side view schematically illustrating the antistatic member in the display device of FIG. 10.
Figure 12:
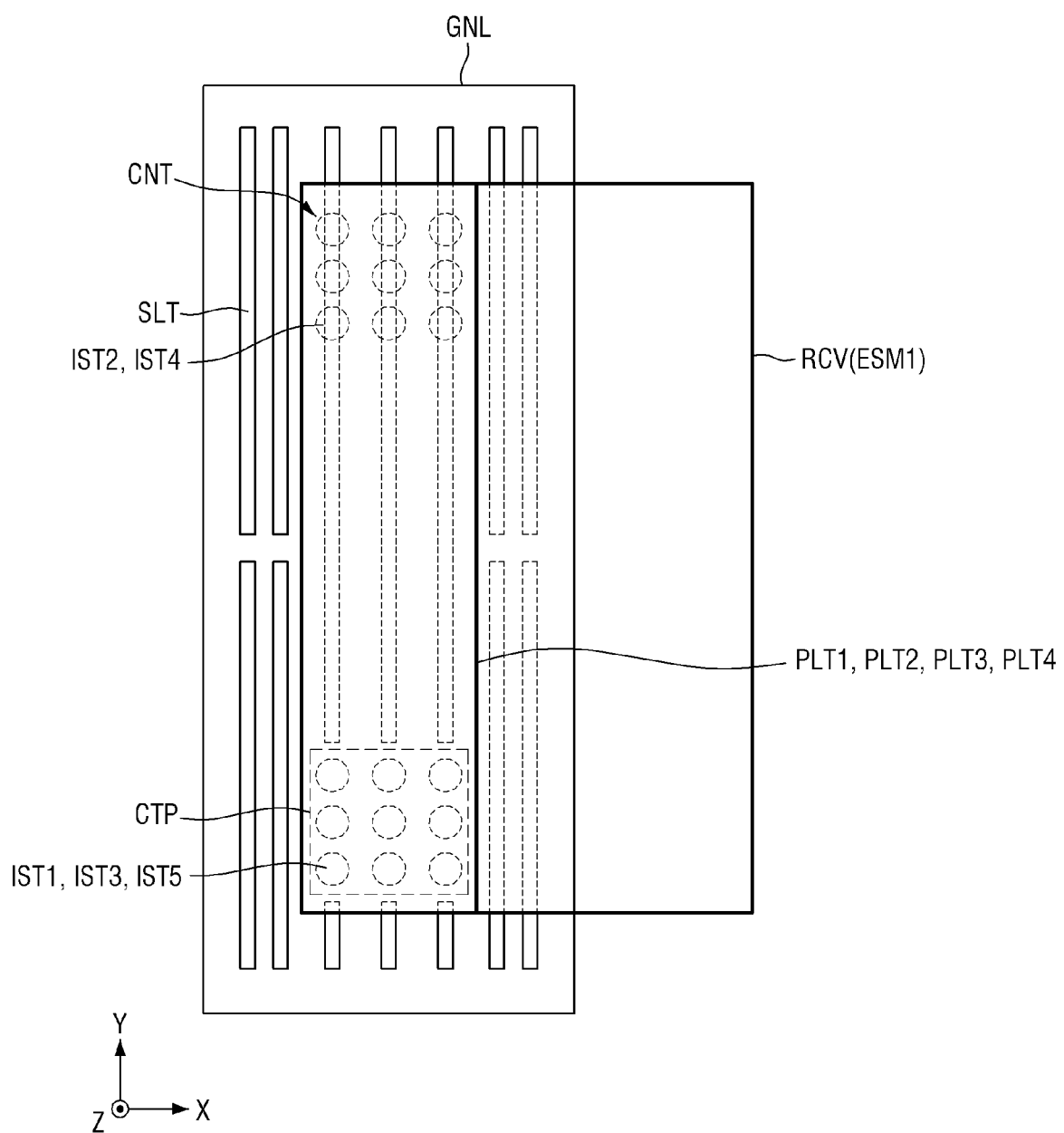
FIG. 12 is a plan view schematically illustrating a connection relationship of the antistatic member and the metal line in the display device of FIG. 10.

FIG. 10 is a schematic cross-sectional view of still another example taken along line I-I' of FIG. 2, FIG. 11 is a schematic side view illustrating the antistatic member in the display device of FIG. 10, and FIG. 12 is a schematic plan view illustrating a connection relationship of the antistatic member and the metal line in the display device of FIG. 10. The display device of FIG. 10 is different from the display device of FIG. 3 in the configuration of the antistatic member ESD. A description of the same configuration as the above-described configuration will be briefly given or omitted.

Referring to FIGS. 10 to 12, the display device 10 may include the first substrate SUB1, the substrate insulating layer SDL, the display layer DPL, the filler FIL, the sealing part AM, the second substrate SUB2, the metal line GNL, and the antistatic member ESD.

The sealing part AM may be disposed between the edge of the first substrate SUB1 and the edge of the second substrate SUB2 in the non-display area NDA. The sealing part AM may be disposed along the edges of the first substrate SUB1 and the second substrate SUB2 in the non-display area NDA to seal the filler FIL. The sealing part AM may bond the first substrate SUB1 and the second substrate SUB2. For example, the sealing part AM may include an organic material. The sealing part AM may be made of an epoxy-based resin, but the disclosure is not limited thereto.

The metal line GNL may be disposed on the thin film transistor layer TFTL in the non-display area NDA. The metal line GNL may extend along at least one edge of the first substrate SUB1. The metal line GNL may be covered by the sealing part AM. For example, the metal line GNL may be disposed on the first passivation layer PAS1, but the disclosure is not limited thereto. The metal line GNL may pass through the non-display area NDA to be electrically connected to the ground pad portion (not shown) disposed on a side of the first substrate SUB1.

The metal line GNL may be grounded by a specific voltage through the ground pad portion. The metal line GNL may be grounded so that the static electricity introduced from the outside may be induced to the exterior of the display device 10. The metal line GNL may prevent the static electricity introduced from the outside from entering the display layer DPL.

The antistatic member ESD may be disposed between the first substrate SUB1 and the second substrate SUB2 in the non-display area NDA. One end (or first end) of the antistatic member ESD may be exposed to face the outside of the display device 10, and the other end (or second end) of the antistatic member ESD may be electrically connected to the metal line GNL. The antistatic member ESD may include the receiver RCV and first to fourth plates PLT1 to PLT4, so that a part of the static electricity introduced from the outside through first to fifth capacitors CAP1 to CAP5 which are formed between the receiver RCV, the first to fourth plates PLT1 to PLT4, and the metal line GNL may be released. The antistatic member ESD may induce another part of the static electricity to the metal line GNL. For example, the amount of the static electricity released by the antistatic member ESD may be significantly greater than the amount of the static electricity induced to the metal line GNL. Accordingly, the antistatic member ESD may prevent the static electricity from entering the display layer DPL by inducing only a fine amount of static electricity to the metal line GNL.

As illustrated in FIG. 11, the antistatic member ESD may include first to fifth antistatic members ESM1 to ESM5.

The first antistatic member ESM1 may include the receiver RCV and a first insertion part IST1.

The receiver RCV may protrude to the exterior of the sealing part AM. The receiver RCV may protrude toward the outside of the first substrate SUB1. The end of the receiver RCV may be parallel to the end of the first substrate SUB1 or the end of the second substrate SUB2, but the disclosure is not limited thereto. A part of the receiver RCV may be connected to the first insertion part IST1 to be covered by the sealing part AM, and another part thereof may protrude from the sealing part AM. The receiver RCV may be a metal plate extending along at least one edge of the first substrate SUB1. For example, the receiver RCV may contact the bottom surface of the color filter layer CFL or the wavelength conversion layer WLCL, but is the disclosure not limited thereto. As another example, the receiver RCV may be spaced apart by a predetermined distance from the bottom surface of the color filter layer CFL or the wavelength conversion layer WLCL.

The first insertion part IST1 may protrude from one side (or first side) of the bottom of the receiver RCV toward the metal line GNL or the first plate PLT1. The first insertion part IST1 may be inserted into the first plate PLT1 of the second antistatic member ESM2 so that the first and second antistatic members ESM1 and ESM2 may be electrically connected to each other. Accordingly, the first antistatic member ESM1 may release a part of the static electricity introduced through the receiver RCV, through the first capacitor CAP1, and another part of the static electricity may be provided to the first plate PL1 through the first insertion part IST1.

The second antistatic member ESM2 may include the first plate PLT1 and a second insertion part IST2.

The first plate PLT1 may be disposed below the receiver RCV and may be electrically connected to the receiver RCV by the first insertion part IST1 inserted into the contact hole CNT. The first plate PLT1 may be spaced apart by a predetermined distance from the receiver RCV. The first plate PLT1 may be a metal plate extending along at least one edge of the first substrate SUB1. The first capacitor CAP1 may be formed by the receiver RCV and the first plate PLT1 facing each other. The first plate PLT1 may be covered by the sealing part AM. Accordingly, the length of the first plate PLT1 in the first direction (e.g., the X-axis direction) may be shorter than the length of the receiver RCV in the first direction (e.g., the X-axis direction).

The second insertion part IST2 may protrude from the other side (or second side) of the bottom of the first plate PLT1 toward the metal line GNL or the second plate PLT2. The second insertion part IST2 may be inserted into the second plate PLT2 of the third antistatic member ESM3 so that the second and third antistatic members ESM2 and ESM3 may be electrically connected to each other. Accordingly, the second antistatic member ESM2 may release a part of the static electricity introduced through the first antistatic member ESM1 through a second capacitor CAP2 and another part of the static electricity may be provided to the second plate PLT2 through the second insertion part IST2.

The third antistatic member ESM3 may include the second plate PLT2 and a third insertion part IST3.

The second plate PLT2 may be disposed below the first plate PLT1 and may be electrically connected to the first plate PLT1 by the second insertion part IST2 inserted into the contact hole CNT. The second plate PLT2 may be spaced apart by a predetermined distance from the first plate PLT1. The second plate PLT2 may be a metal plate extending along at least one edge of the first substrate SUB1. The second capacitor CAP2 may be formed by the first and second plates PLT1 and PLT2 facing each other. The second plate PLT2 may be covered by the sealing part AM.

The third insertion part IST3 may protrude from the one side of the bottom of the second plate PLT2 toward the metal line GNL or the third plate PLT3. The third insertion part IST3 may overlap the first insertion part IST1 in the thickness direction (the Z-axis direction). The third insertion part IST3 may be inserted into the third plate PLT3 of the fourth antistatic member ESM4 so that the third and fourth antistatic members ESM3 and ESM4 may be electrically connected to each other. Accordingly, the third antistatic member ESM3 may release a part of the static electricity introduced through the second antistatic member ESM2, through a third capacitor CAP3 and another part of the static electricity may be provided to the third plate PLT3 through the third insertion part IST3.

The fourth antistatic member ESM4 may include the third plate PLT3 and the fourth insertion part IST4.

The third plate PLT3 may be disposed under the second plate PLT2 and may be electrically connected to the second plate PLT2 by the third insertion part IST3 inserted into the contact hole CNT. The third plate PLT3 may be spaced apart by a predetermined distance from the second plate PLT2. The third plate PLT3 may be a metal plate extending along at least one edge of the first substrate SUB1. The third capacitor CAP3 may be formed by the second and third plates PLT2 and PLT3 facing each other. The third plate PLT3 may be covered by the sealing part AM.

The fourth insertion part IST4 may protrude from the other side of the bottom of the third plate PLT3 toward the metal line GNL or the fourth plate PLT4. The fourth insertion part IST4 may overlap the second insertion part IST2 in the thickness direction (e.g., the Z-axis direction). The fourth insertion part IST4 may be inserted into the fourth plate PLT4 of the fifth antistatic member ESM5 so that the fourth and fifth antistatic members ESM4 and ESM5 may be electrically connected to each other. Accordingly, the fourth antistatic member ESM4 may release a part of the static electricity introduced through the third antistatic member ESM3 through a fourth capacitor CAP4, and another part of the static electricity may be provided to the fourth plate PLT4 through the fourth insertion part IST4.

The fifth antistatic member ESM5 may include the fourth plate PLT4 and the fifth insertion part IST5.

The fourth plate PLT4 may be disposed under the third plate PLT3 and may be electrically connected to the third plate PLT3 by the fourth insertion part IST4 inserted into the contact hole CNT. The fourth plate PLT4 may be spaced apart by a predetermined distance from the third plate PLT3. The fourth plate PLT4 may be a metal plate extending along at least one edge of the first substrate SUB1. The fourth capacitor CAP4 may be formed by the third and fourth plates PLT3 and PLT4 facing each other. The fourth plate PLT4 may be covered by the sealing part AM.

The fifth insertion part IST5 may protrude from the one side of the bottom of the fourth plate PLT4 toward the metal line GNL. The fifth insertion part IST5 may overlap the first and third insertion parts IST1 and IST3 in the thickness direction (e.g., the Z-axis direction). The fifth insertion part IST5 may be inserted into the contact hole CNT of the metal line GNL so that the fifth antistatic member ESM5 and the metal line GNL may be electrically connected to each other. Accordingly, the fifth antistatic member ESM5 may release a part of the static electricity introduced through the fourth antistatic member ESM4, through a fifth capacitor CAP5, and another part of the static electricity may be provided to the metal line GNL through the fifth insertion part IST5.

The antistatic member ESD may release a part of the static electricity introduced from the outside through the first to fifth capacitors CAP1 to CAP5 formed between the receiver RCV, the first to fourth plates PLT1 to PLT4, and the metal line GNL. The antistatic member ESD may induce another part of the static electricity to the metal line GNL. For example, the amount of the static electricity released by the first to fifth capacitors CAP1 to CAP5 may be significantly greater than the amount of the static electricity induced to the metal line GNL. Accordingly, the antistatic member ESD may prevent the static electricity from entering the display layer DPL by inducing only a fine amount of static electricity to the metal line GNL. The display device 10 may prevent the static electricity from entering the display layer DPL, thereby improving the electrostatic discharge sensitivity and preventing the defect of the display device 10 to improve the reliability of the display device 10.

The metal line GNL may include the pad portion CTP and the slits SLT.

The pad portion CTP may include the contact holes CNT and may be connected to the antistatic member ESD. The pad portion CTP may be electrically connected to the antistatic member ESD through the fifth insertion part IST5 inserted into the contact holes CNT. The pad portion CTP may be covered by the slits SLT.

The slits SLT may extend in the extending direction of the metal line GNL. For example, the slits SLT may extend in the second direction (e.g., the Y-axis direction) and be spaced apart from each other in the first direction (e.g., the X-axis direction). The slits SLT may be spaced apart from each other by the pad portion CTP. The metal line GNL may not form the slits SLT in the area of the pad portion CTP to minimize the contact resistance between the pad portion CTP and the antistatic member ESD. The slits SLT may penetrate at least a part of the metal line GNL in the thickness direction (e.g., the Z-axis direction) to adjust the resistance of the metal line GNL.

Figure 13:
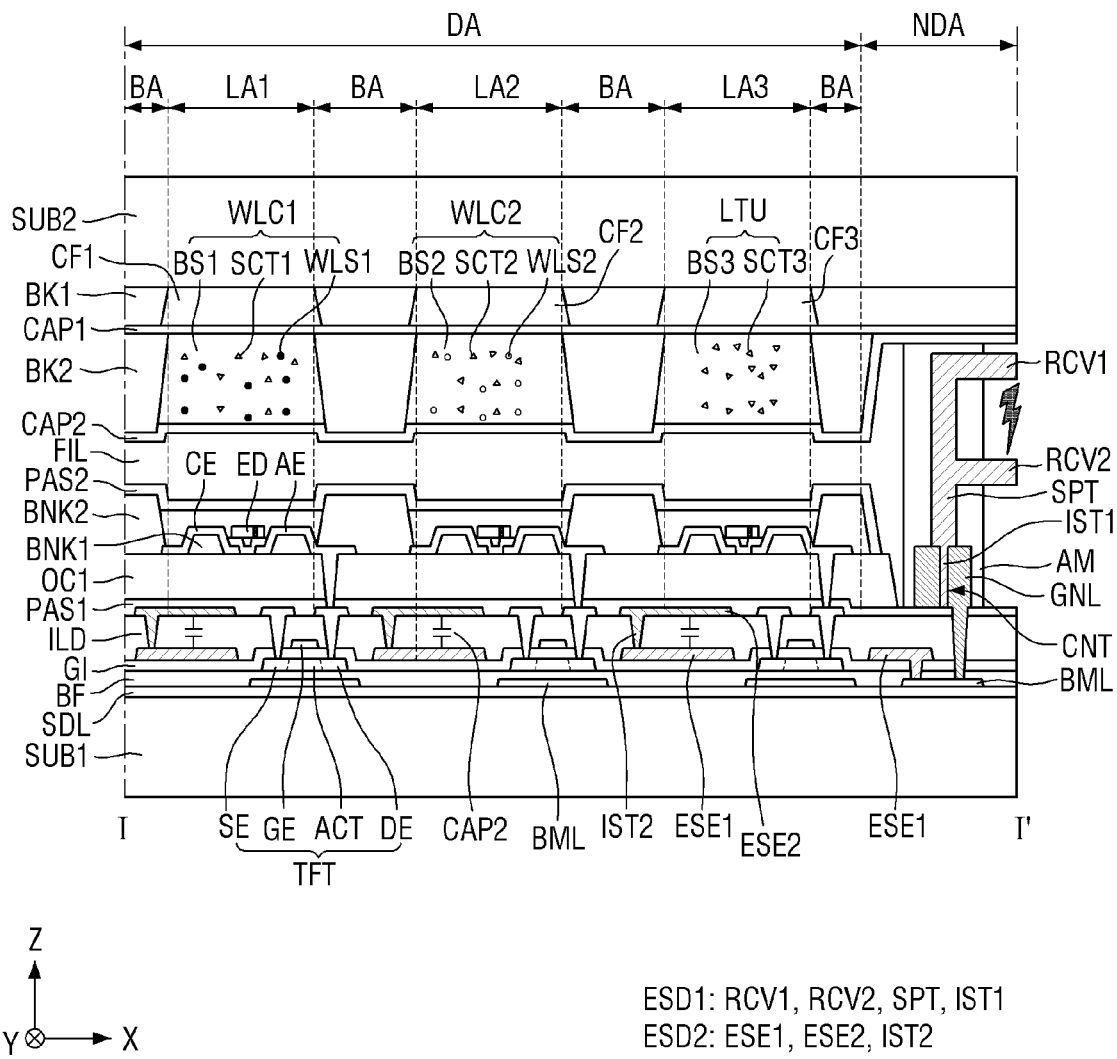
FIG. 13 is a schematic cross-sectional view of still another example taken along line I-I' of FIG. 2.
Figure 14:
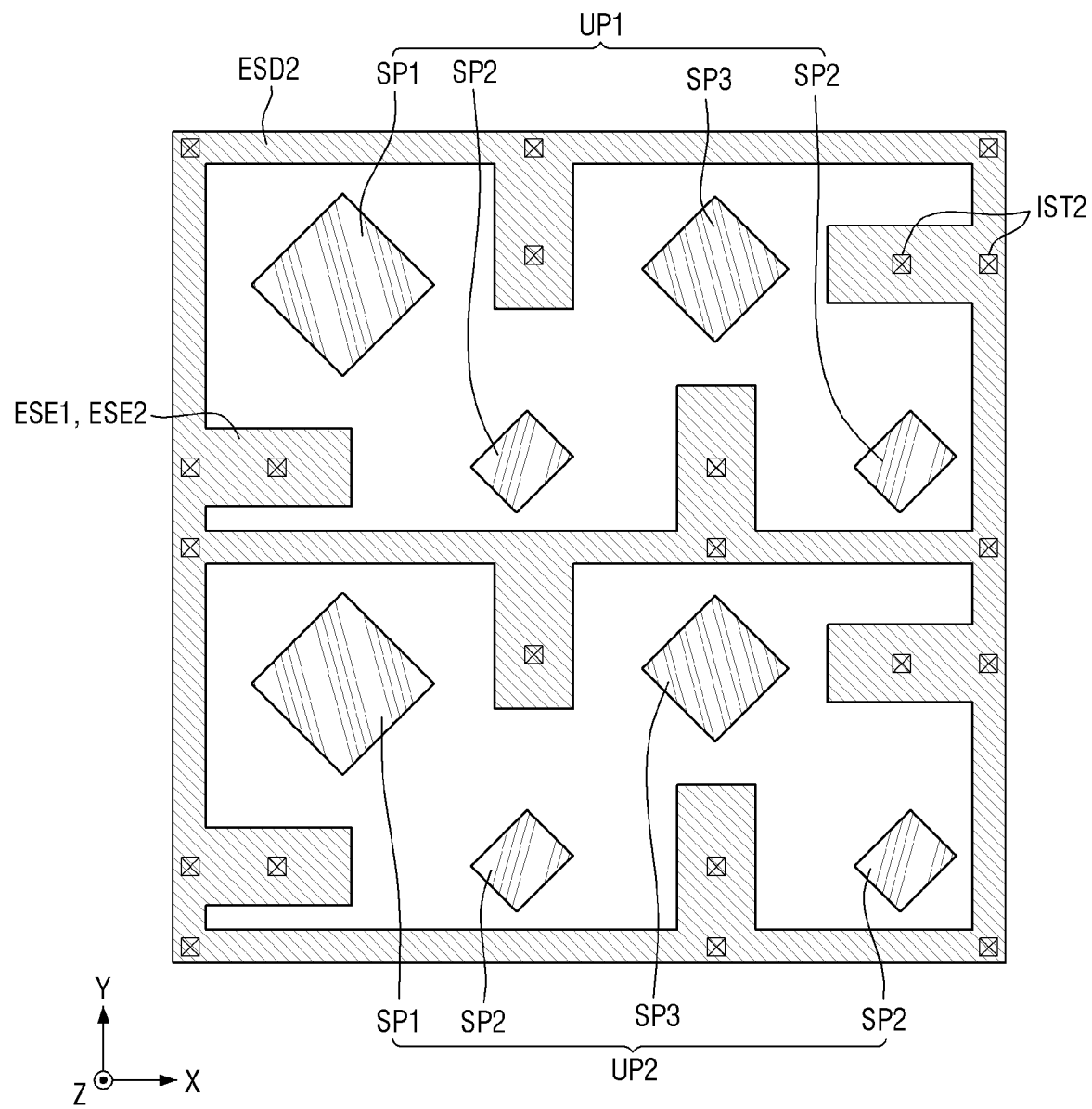
FIG. 14 is a plan view schematically illustrating a unit pixel and an antistatic electrode in the display device of FIG. 13.

FIG. 13 is a schematic cross-sectional view of still another example taken along line I-I' of FIG. 2, and FIG. 14 is a schematic plan view illustrating a unit pixel and an antistatic electrode in the display device of FIG. 13. The display device of FIG. 13 further includes a second antistatic electrode ESD2 in the display device of FIG. 3. A description of the same configuration as the above-described configuration will be briefly given or omitted.

Referring to FIGS. 13 and 14, the display device 10 may include the first substrate SUB1, the substrate insulating layer SDL, the display layer DPL, the filler FIL, the sealing part AM, the second substrate SUB2, the metal line GNL, a first antistatic member ESD1, and the second antistatic electrode ESD2.

The first antistatic member ESD1 may be disposed between the first substrate SUB1 and the second substrate SUB2 in the non-display area NDA. One end (or first end) of the first antistatic member ESD1 may be exposed toward the outside of the display device 10, and the other end (or second end) thereof may be electrically connected to the metal line GNL. The first antistatic member ESD1 may discharge a part of the electrostatic energy introduced from the outside to consume it and another part of the electrostatic energy may be induced to the metal line GNL. For example, the amount of the static electricity released by the first antistatic member ESD1 may be significantly greater than the amount of the static electricity induced to the metal line GNL. Accordingly, the first antistatic member ESD1 may prevent the electrostatic energy from entering the display layer DPL by inducing only a fine amount of static electricity to the metal line GNL.

The first antistatic member ESD1 may include the support SPT, the first receiver RCV1, the second receiver RCV2 and the first insertion part IST1. The first capacitor CAP1 may be formed by the first and second receiver RCV1 and RCV2 spaced apart to face each other.

The second antistatic electrode ESD2 may be disposed on the thin film transistor layer TFTL. The second antistatic electrode ESD2 may surround each of first and second unit pixels UP1 and UP2. Here, each of the first and second unit pixels UP1 and UP2 may include a first pixel SP1, two second pixels SP2 and a third pixel SP2 respectively, but the configuration of the first to third pixels SP1, SP2, and SP3 may not be limited thereto. The first to third pixels SP1, SP2, and SP3 may emit light of different colors.

The second antistatic electrode ESD2 may include a first antistatic electrode ESE1, a second antistatic electrode ESE2, and the second insertion part IST2.

The first antistatic electrode ESE1 may be disposed on the first substrate SUB1. The first antistatic electrode ESE1 may be disposed on the gate insulating layer GI. The first antistatic electrode ESE1 and the gate electrode GE of the thin film transistor TFT may be disposed on the same layer, but the stacking location of the first antistatic electrode ESE1 is not limited thereto. The first antistatic electrode ESE1 may be electrically connected to the metal line GNL. The metal line GNL may provide another part of the static electricity introduced through the first antistatic member ESD1 to the first antistatic electrode ESE1.

The second antistatic electrode ESE2 may be disposed on the first antistatic electrode ESE1. The second antistatic electrode ESE2 may be disposed on the interlayer insulating layer ILD. The second antistatic electrode ESE2 and the first and second connection electrodes CNE1 and CNE2 may be disposed on the same layer, but the stacking location of the second antistatic electrode ESE2 is not limited thereto. The second antistatic electrode ESE2 may be spaced from the first antistatic electrode ESE1 with the interlayer insulating layer ILD therebetween. The second capacitor CAP2 may be formed by the first and second antistatic electrodes ESE1 and ESE2 spaced apart to face each other.

The second antistatic electrode ESE2 may be electrically connected to the first antistatic electrode ESE1 through the second insertion part IST2 inserted into the contact hole of the interlayer insulating layer ILD. As illustrated in FIG. 14, the second antistatic electrode ESD2 may include the second insertion parts IST2 surrounding the first and second unit pixels UP1 and UP2, and the first and second antistatic electrodes ESE1 and ESE2 may be electrically connected to each other.

The second antistatic electrode ESD2 may release the static electricity introduced from the metal line GNL through the second capacitor CAP2. Accordingly, the display device 10 may release a significant amount of static electricity introduced from the outside by including the first antistatic member ESD1 and prevent another part of the static electricity from entering the first and second unit pixels UP1 and UP2 by further including the second antistatic electrode ESD2. The display device 10 may prevent the static electricity from entering the pixels, thereby improving the electrostatic discharge sensitivity, and may prevent the defect of the display device 10, thereby improving the reliability of the display device 10.

Figure 15:
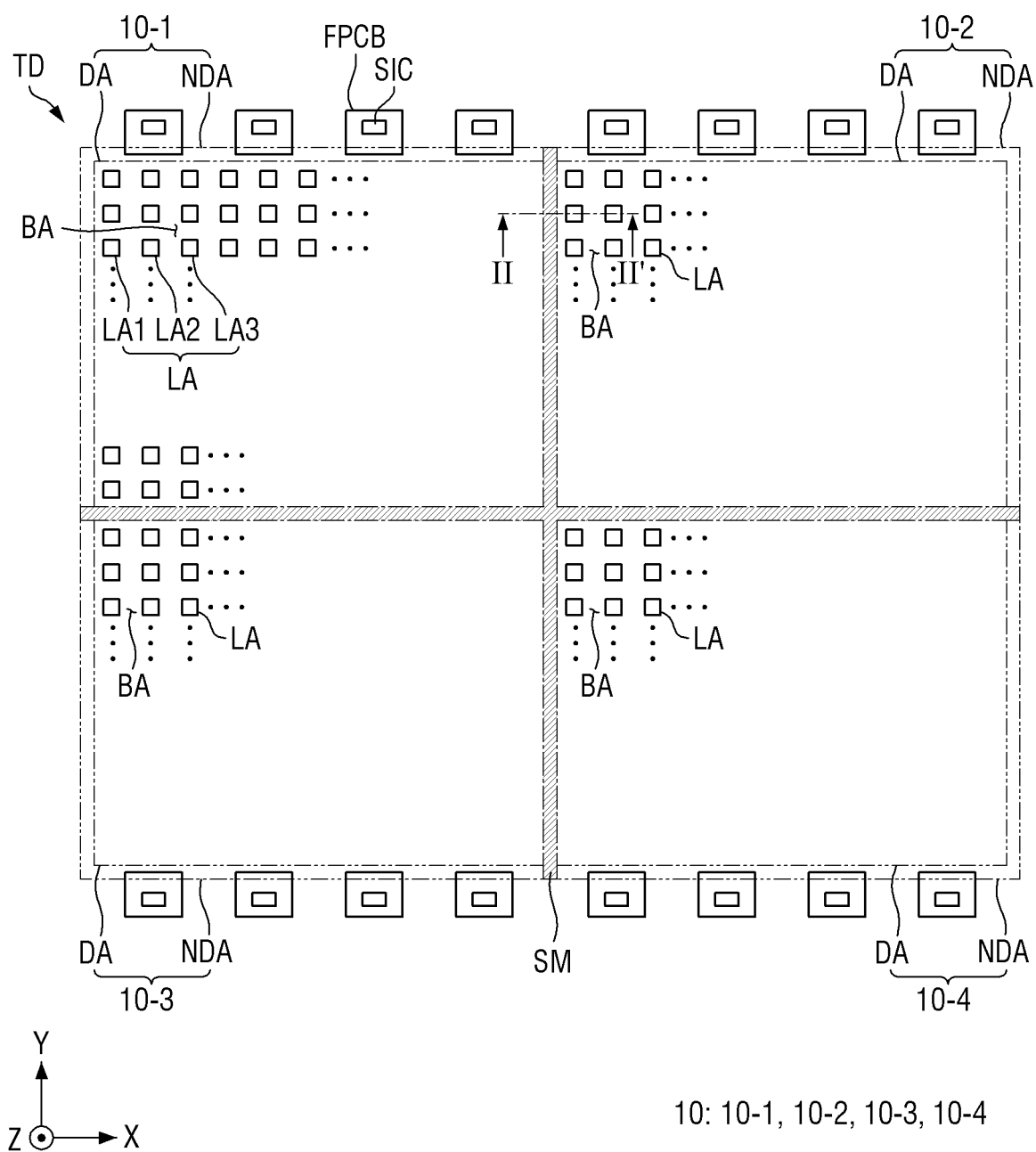
FIG. 15 is a plan view schematically illustrating a connection structure of a tiled display device according to an embodiment.
Figure 16:
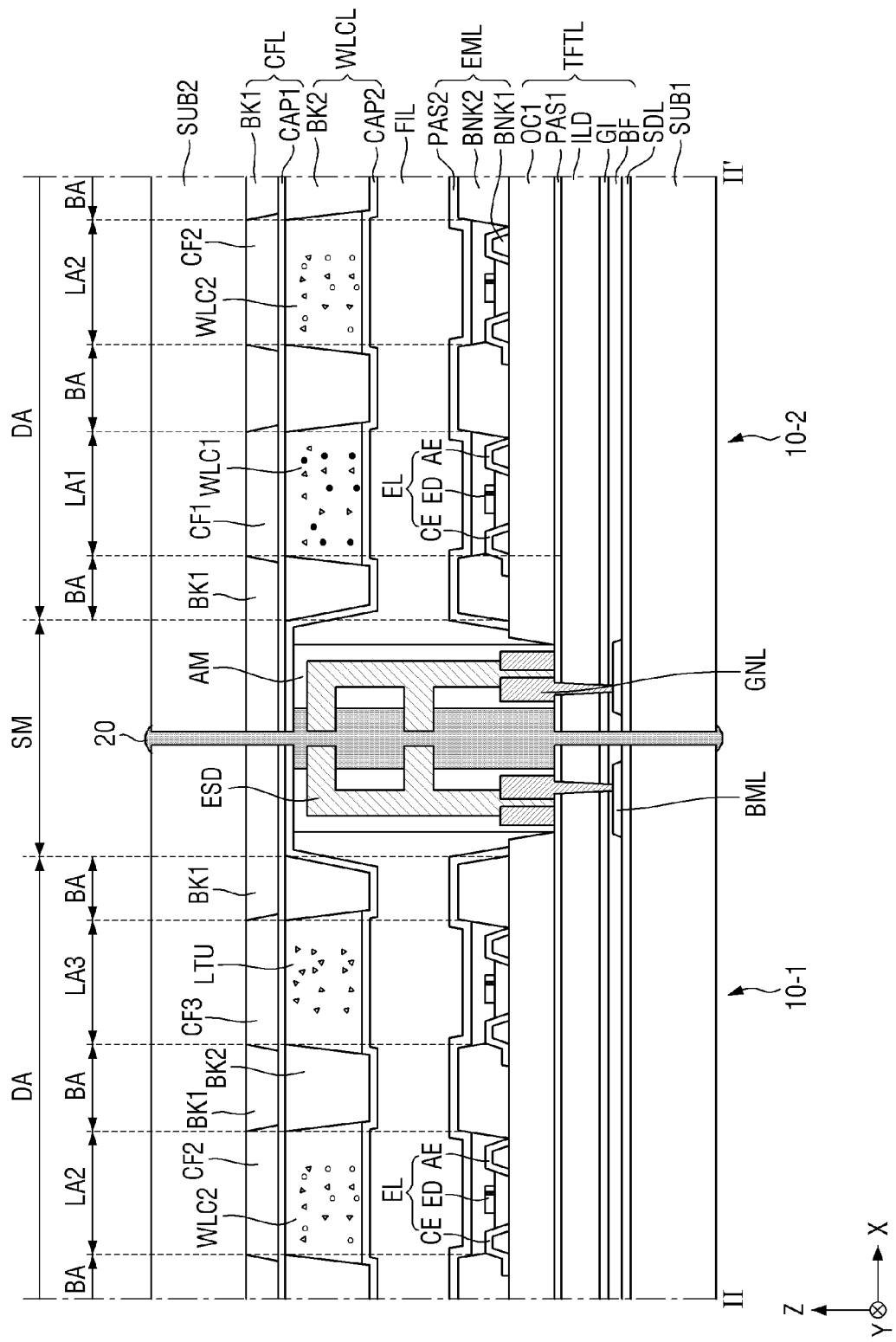
FIG. 16 is a schematic cross-sectional view taken along line II-II' of FIG. 15.

FIG. 15 is a schematic plan view illustrating a connection structure of a tiled display device according to an embodiment, and FIG. 16 is a schematic cross-sectional view taken along line II-II' of FIG. 15. Hereinafter, the same configurations as the above-described configurations will be briefly described or omitted.

Referring to FIGS. 15 and 16, a tiled display device TD may include display devices 10. The display devices 10 may be arranged in grid form, but the disclosure is not limited thereto. The display devices 10 may be connected in a first direction (e.g., an X-axis direction) or a second direction (e.g., a Y-axis direction), and the tiled display device TD may have a particular shape.

The display device 10 may include a display area DA and a non-display area NDA. The display area DA may include pixels to display an image. The non-display area NDA may be disposed around the display area DA to surround the display area DA, and may not display an image.

The tiled display device TD may include a coupling area SM disposed between display areas DA. The tiled display device TD may be formed by connecting non-display areas NDA of the adjacent display devices 10. The display devices 10 may be connected to each other by a bonding member 20 disposed in the coupling area SM. The distance between the display areas DA of the display devices 10 may be small enough that the coupling area SM between the display devices 10 is not recognized by the user. The reflectance of external light of the display areas DA of the display devices 10 may be substantially the same as that of the coupling area SM between the display devices 10. Accordingly, in the tiled display device TD, the coupling area SM between the display devices 10 may be prevented from being recognized by the user, thereby removing a sense of disconnection between the display devices 10 and improving a sense of immersion in an image.

The tiled display device TD may include first to fourth display devices 10-1 to 10-4. The number and connection relationship of the display devices 10 are not limited to the embodiment of FIG. 15. The number of the display devices 10 may be determined according to the size of each of the display devices 10 and the tiled display device TD.

The bonding member 20 may be disposed between the display devices 10 to bond the side surfaces of the adjacent display devices 10 to each other. The bonding member 20 may connect the side surfaces of the first to fourth display devices 10-1 to 10-4 arranged in a grid form to implement the tiled display device TD. The bonding member 20 may bond the side surfaces of the first substrate SUB1 and the second substrate SUB2 of each of the display devices 10 adjacent to each other.

For example, the bonding member 20 may be made of an adhesive or a double-sided tape having a relatively thin thickness to minimize the gap between the display devices 10. As another example, the bonding member 20 may be formed as a bonding frame having a relatively thin thickness to minimize the width of the coupling area SM or the gap between the display devices 10. Accordingly, in the tiled display device TD, the coupling area SM between the display devices 10 may be prevented from being recognized by the user, thereby removing a sense of disconnection between the display devices 10 and improving a sense of immersion in an image.

A flexible film FPCB may be disposed in the non-display area NDA provided on a side of the tiled display device TD. For example, the flexible film FPCB may be disposed in the non-display area NDA on upper sides of the first and second display devices 10-1 and 10-2 and in the non-display area NDA on lower sides of the third and fourth display devices 10-3 and 10-4. The flexible film FPCB may be attached to a pad portion (not shown) disposed on a first substrate SUB1 of each of the first to fourth display devices 10-1, 10-2, 10-3, and 10-4. A side of the flexible film FPCB may be connected to the pad portion, and another side of the flexible film FPCB may be connected to a source circuit board (not shown). The flexible film FPCB may transmit a source voltage or data voltage of a source driver SIC to the display device 10.

The source driver SIC may be disposed on the flexible film FPCB and may be electrically connected to the pixels of the display device 10. For example, the source driver SIC may be an integrated circuit (IC). In response to a source control signal of a timing controller, the source driver SIC may convert digital video data into an analog data voltage and may supply it to a data line of the display area DA through the flexible film FPCB.

As illustrated in FIG. 16, the antistatic member ESD of the first display device 10-1 and the antistatic member ESD of the second display device 10-2 may face each other with the bonding member 20 therebetween. The antistatic member ESD of each of the first and second display devices 10-1 and 10-2 may be insulated by the bonding member 20.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device comprising:
   a first substrate including:
     a display area comprising a plurality of pixels; and
     a non-display area surrounding the display area;
   a thin film transistor layer disposed on the first substrate and comprising a thin film transistor;
   a second substrate disposed on the thin film transistor layer and facing the first substrate;

a sealing part disposed between the first substrate and the second substrate in the non-display area, and bonding the first substrate and the second substrate;
a metal line disposed in the non-display area on the thin film transistor layer and overlapping the sealing part; and
an antistatic member comprising:
a support supported by the metal line;
a first receiver protruding from a top portion of the support toward an exterior of the sealing part; and
a second receiver protruding from a bottom portion of the support toward the exterior of the sealing part and facing the first receiver.

2. The display device of claim 1, wherein the metal line includes:
a pad portion including a plurality of contact holes, the pad portion being electrically connected to the antistatic member; and
a plurality of slits extending in a first direction in a plan view, spaced apart by the pad portion, and penetrating the metal line in a thickness direction of the display device.

3. The display device of claim 2, wherein the antistatic member comprises a plurality of insertion parts protruding from a lower end of the support and inserted into the plurality of contact holes of the pad portion.

4. The display device of claim 1, wherein the first receiver and the second receiver are implemented as metal plates spaced apart from each other, facing each other, and forming a capacitor.

5. The display device of claim 1, wherein the metal line extends along the non-display area and is grounded with a voltage.

6. The display device of claim 1, further comprising a substrate insulating layer directly contacting and overlapping an entire top surface of the first substrate.

7. The display device of claim 1, further comprising:
a light emitting element layer disposed on the thin film transistor layer and including a light emitting element;
a wavelength conversion layer disposed on the light emitting element layer and including a wavelength conversion part corresponding to each of the plurality of pixels; and
a color filter layer disposed between the wavelength conversion layer and the second substrate, the color filter layer including a color filter corresponding to each of the plurality of pixels.

8. The display device of claim 1, wherein the thin film transistor layer comprises an antistatic electrode surrounding each of the plurality of pixels.

9. The display device of claim 8, wherein the antistatic electrode includes:
a first antistatic electrode disposed on the first substrate; and
a second antistatic electrode disposed on the first antistatic electrode, spaced apart from the first antistatic electrode, and facing the first antistatic electrode.

10. The display device of claim 9, wherein
the thin film transistor layer comprises a connection electrode electrically connecting the thin film transistor to the light emitting element,
the first antistatic electrode and a gate electrode of the thin film transistor are disposed on a same layer, and
the second antistatic electrode and the connection electrode are disposed on a same layer.

11. A display device comprising:
a first substrate including:
a display area comprising a plurality of pixels; and
a non-display area surrounding the display area;
a thin film transistor layer disposed on the first substrate and comprising a plurality of thin film transistors;
a pixel electrode disposed on the thin film transistor layer;
a common electrode spaced apart from the pixel electrode and facing the pixel electrode;
a second substrate disposed on the common electrode and facing the first substrate;
a sealing part disposed between the first substrate and the second substrate in the non-display area, and bonding the first substrate and the second substrate;
a metal line disposed in the non-display area on the thin film transistor layer and overlapping the sealing part; and
an antistatic member comprising:
a support supported by the metal line and electrically connected to the common electrode; and
a receiver protruding from a bottom of the support toward an exterior of the sealing part and facing the common electrode.

12. The display device of claim 11, wherein the common electrode and the receiver are implemented as metal plates spaced apart from each other, facing each other, and forming a capacitor.

13. A display device comprising:
a first substrate including:
a display area comprising a plurality of pixels; and
a non-display area surrounding the display area;
a thin film transistor layer disposed on the first substrate and comprising a plurality of thin film transistors;
a second substrate disposed on the thin film transistor layer and facing the first substrate;
a sealing part disposed between the first substrate and the second substrate in the non-display area, and bonding the first substrate and the second substrate;
a metal line disposed in the non-display area on the thin film transistor layer and overlapping the sealing part; and
an antistatic member comprising:
at least one plate electrically connected to the metal line and facing the metal line; and
a receiver electrically connected to the at least one plate, protruding toward an exterior of the sealing part, and facing the at least one plate.

14. The display device of claim 13, wherein the antistatic member comprises:
a first antistatic member including the receiver and a first insertion part protruding from the receiver toward the metal line;
a second antistatic member including:
a first plate electrically connected to the first insertion part and facing the receiver; and
a second insertion part protruding from the first plate toward the metal line; and
a third antistatic member including:
a second plate electrically connected to the second insertion part and facing the first plate; and
a third insertion part protruding from the second plate and electrically connected to the metal line.

15. The display device of claim 14, wherein the antistatic member comprises a plurality of plates and a plurality of insertion parts disposed between the second antistatic member and the third antistatic member.

16. The display device of claim 14, wherein
the first insertion part is disposed on a side of the receiver,
the second insertion part is disposed on another side of the first plate, and
the first and second insertion parts are spaced apart from each other in a plan view.

17. The display device of claim 14, wherein
the receiver and the first plate are spaced apart from each other, facing each other, and forming a first capacitor,
the first plate and the second plate are spaced apart from each other, facing each other, and forming a second capacitor, and
the second plate and the metal line are spaced apart from each other, facing each other, and forming a third capacitor.

18. The display device of claim 13, further comprising a substrate insulating layer directly contacting and overlapping an entire top surface of the first substrate.

19. A tiled display device comprising:
a first display device including a first display area comprising pixels;
a second display device including a second display area adjacent to the first display area; and
a bonding member connecting the first display device to the second display device, wherein
each of the first and second display devices comprises:
a first substrate including a display area and a non-display area;
a thin film transistor layer disposed on the first substrate;
a second substrate disposed on the thin film transistor layer and facing the first substrate;
a sealing part disposed between the first substrate and the second substrate in the non-display area, and bonding the first substrate and the second substrate;
a metal line disposed in the non-display area on the thin film transistor layer and overlapping the sealing part; and
an antistatic member comprising:
a support supported by the metal line;
a first receiver protruding from a top portion of the support toward an exterior of the sealing part; and
a second receiver protruding from a bottom portion of the support toward the exterior of the sealing part and facing the first receiver,
the antistatic member of the first display device and the antistatic member of the second display device face each other, and
the bonding member is disposed between the antistatic member of the first display device and the antistatic member of the second display device.

20. The display device of claim 19, wherein the first receiver and the second receiver are implemented as metal plates spaced apart, face each other, and form a capacitor.

\* \* \* \* \*